(12) United States Patent
Mizushima et al.

(10) Patent No.: US 9,443,774 B2
(45) Date of Patent: Sep. 13, 2016

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Tomonori Mizushima, Matsumoto (JP); Yusuke Kobayashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/247,973

(22) Filed: Apr. 8, 2014

(65) Prior Publication Data
US 2014/0217407 A1    Aug. 7, 2014

Related U.S. Application Data

(63) Continuation of application No. PCT/JP2012/079674, filed on Nov. 15, 2012.

(30) Foreign Application Priority Data

Nov. 15, 2011    (JP) .................................. 2011-249982

(51) Int. Cl.
*H01L 23/58*    (2006.01)
*H01L 29/10*    (2006.01)
(Continued)

(52) U.S. Cl.
CPC .............. *H01L 22/12* (2013.01); *H01L 21/263* (2013.01); *H01L 21/26506* (2013.01);
(Continued)

(58) Field of Classification Search
CPC ............. H01L 22/12; H01L 21/26506; H01L 21/263; H01L 21/324; H01L 22/30; H01L 29/66348; H01L 29/7397; H01L 29/8611; H01L 29/32; H01L 29/36; H01L 29/66128; H01L 29/0619

See application file for complete search history.

(56) References Cited

U.S. PATENT DOCUMENTS 6,075,296 A    6/2000    Kasbergen
6,482,681 B1   11/2002   Francis et al.
(Continued)

FOREIGN PATENT DOCUMENTS

CN    101305470    11/2008
JP    2000-31800    1/2000
(Continued)

OTHER PUBLICATIONS

Japanese Office Action dated Dec. 16, 2014 in corresponding Japanese Patent Application No. 2013-544320.
(Continued)

*Primary Examiner* — Jarrett Stark

(57) ABSTRACT

A donor layer that is formed by performing a heat treatment for a crystal defect formed by proton radiation is provided in an n-type drift layer of an n⁻ semiconductor substrate. The donor layer has an impurity concentration distribution including a portion with the maximum impurity concentration and a portion with a concentration gradient in which the impurity concentration is reduce to the same impurity concentration as that of the n-type drift layer in a direction from the portion with the maximum impurity concentration to both surfaces of the n-type drift layer. The crystal defect formed in the n-type drift layer is a composite crystal defect mainly caused by a vacancy, oxygen, and hydrogen.

13 Claims, 19 Drawing Sheets

(51) Int. Cl.

| | | |
|---|---|---|
| H01L 21/66 | (2006.01) | |
| H01L 29/32 | (2006.01) | |
| H01L 29/36 | (2006.01) | |
| H01L 29/66 | (2006.01) | |
| H01L 29/861 | (2006.01) | |
| H01L 29/739 | (2006.01) | |
| H01L 21/263 | (2006.01) | |
| H01L 21/265 | (2006.01) | |
| H01L 21/324 | (2006.01) | |
| H01L 29/06 | (2006.01) | |

(52) U.S. Cl.
CPC ............ *H01L 21/324* (2013.01); *H01L 22/30* (2013.01); *H01L 29/32* (2013.01); *H01L 29/36* (2013.01); *H01L 29/66128* (2013.01); *H01L 29/66348* (2013.01); *H01L 29/7397* (2013.01); *H01L 29/8611* (2013.01); *H01L 29/0619* (2013.01)

(56) References Cited

U.S. PATENT DOCUMENTS

| | | | |
|---|---|---|---|
| 9,276,071 B2 * | 3/2016 | Yoshimura | .............. H01L 29/32 |
| 2001/0005024 A1 | 6/2001 | Bauer et al. | |
| 2004/0041225 A1 | 3/2004 | Nemoto | |
| 2005/0280076 A1 | 12/2005 | Barthelmess et al. | |
| 2006/0286753 A1 | 12/2006 | Barthelmess et al. | |
| 2008/0315364 A1 | 12/2008 | Nemoto | |
| 2011/0042791 A1 | 2/2011 | Schulze et al. | |

FOREIGN PATENT DOCUMENTS

| | | |
|---|---|---|
| JP | 2002-520885 | 7/2002 |
| JP | 2003-318412 | 11/2003 |
| JP | 2003-533047 | 11/2003 |
| JP | 2006-344977 | 12/2006 |
| JP | 2007-55352 | 3/2007 |
| JP | 2008-10846 | 1/2008 |
| JP | 2008-91853 | 4/2008 |
| JP | 2009-99705 | 5/2009 |
| JP | 2009-524227 | 6/2009 |
| JP | 2011-49300 | 3/2011 |
| WO | WO 00/04596 | 1/2000 |
| WO | WO 01/86712 A1 | 11/2001 |
| WO | WO 2011/052787 A1 | 5/2011 |
| WO | WO 2013/073623 A1 | 5/2013 |

OTHER PUBLICATIONS

Hazdra, P. et al., "Local lifetime control in silicon power diode by ion irradiation: introduction and stability of shallow donors," *IET Circuits Devices Syst.*, vol. 1, No. 5, Oct. 2007, pp. 321-326.

Extended European Search Report mailed Apr. 28, 2015 in corresponding European Patent Application No. 12850530.2.

Chinese Office Action dated Dec. 29, 2015 in corresponding Chinese Patent Application No. 201280050659.7, 18 pages.

* cited by examiner

FIG. 18

| RATED VOLTAGE (V) | BREAKDOWN VOLTAGE (V) | TOTAL THICKNESS OF SUBSTRATE (μm) | RESISTIVITY (Ω cm) | AVERAGE CONCENTRATION OF DRIFT LAYER (/cm³) | RATED CURRENT DENSITY (A/cm²) | DISTANCE INDEX L (μm) | BB REGION WHICH END OF DEPLETION LAYER REACHES FIRST: DISTANCE X FROM REAR SURFACE (μm) | | | | | | | | | | |
|---|---|---|---|---|---|---|---|---|---|---|---|---|---|---|---|---|---|
| | | | | | | | W0−0.7L | W0−0.8L | W0−0.9L | W0−1.0L | W0−1.1L | W0−1.2L | W0−1.3L | W0−1.4L | W0−1.5L | W0−1.6L |
| 600 | 700 | 60 | 30 | $1.5 \times 10^{14}$ | 300 | 34.5 | 35.9 | 32.4 | 29.0 | 25.5 | 22.1 | 18.6 | 15.2 | 11.7 | 8.3 | 4.8 |
| 1200 | 1400 | 120 | 60 | $7.7 \times 10^{13}$ | 200 | 62.9 | 76.0 | 69.7 | 63.4 | 57.1 | 50.8 | 44.5 | 38.2 | 31.9 | 25.7 | 19.4 |
| 1700 | 1900 | 170 | 85 | $5.4 \times 10^{13}$ | 100 | 97.2 | 101.9 | 92.2 | 82.5 | 72.8 | 63.0 | 53.3 | 43.6 | 33.9 | 24.1 | 14.4 |
| 3300 | 3500 | 330 | 165 | $2.8 \times 10^{13}$ | 50 | 185.5 | 200.2 | 181.6 | 163.1 | 144.5 | 126.0 | 107.4 | 88.9 | 70.3 | 51.8 | 33.2 |
| 4500 | 4700 | 450 | 225 | $2.0 \times 10^{13}$ | 30 | 265.5 | 264.2 | 237.6 | 211.1 | 184.5 | 158.0 | 131.4 | 104.9 | 78.3 | 51.8 | 25.2 |
| 6500 | 6700 | 650 | 325 | $1.4 \times 10^{13}$ | 20 | 384.8 | 380.6 | 342.2 | 303.7 | 265.2 | 226.7 | 188.2 | 149.8 | 111.3 | 72.8 | 34.3 |

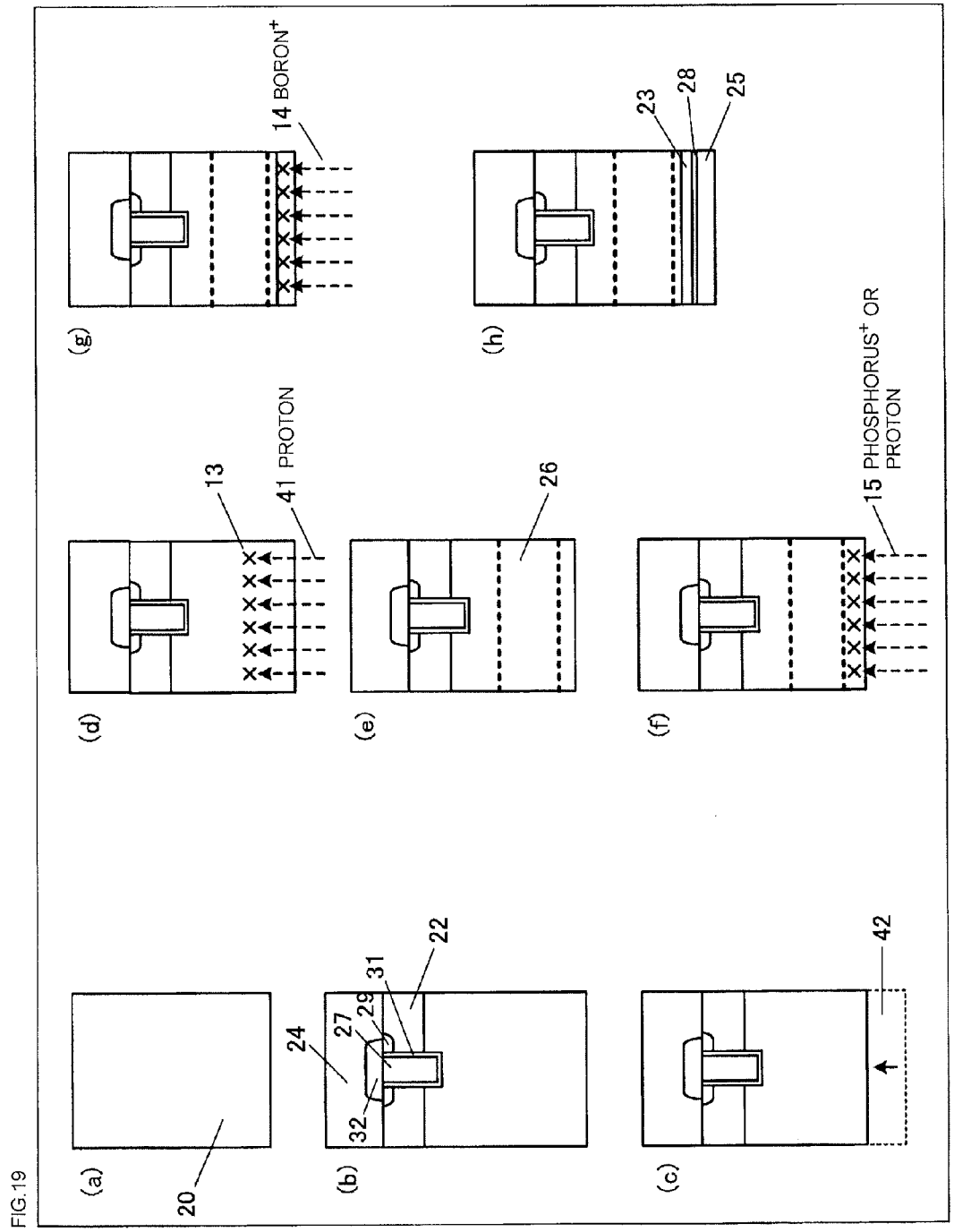

SEMICONDUCTOR DEVICE AND METHOD OF MANUFACTURING SEMICONDUCTOR DEVICE

CROSS-REFERENCE TO RELATED APPLICATIONS

This application is a continuation application, filed under 35 U.S.C. §111(a), of International Application PCT/JP2012/079674 filed on Nov. 15, 2012, and claims foreign priority benefit of Japanese Patent Application 2011-249982 filed on Nov. 15, 2011 in the Japanese Patent Office, the disclosures of both of which are incorporated herein by reference.

BACKGROUND

1. Field

Embodiments of the invention relate to a semiconductor device and a method of manufacturing a semiconductor device.

2. Description of the Related Art

For example, a diode or an insulated gate bipolar transistor (IGBT) with a breakdown voltage of 600 V or 1200 V has been known as a power semiconductor device. The power semiconductor device is generally used in a power conversion device, such as a converter or an inverter, and needs to have characteristics such as low loss, low power consumption, a high processing speed, and high efficiency. In recent years, a semiconductor device in which a drift layer has a field stop (FS) layer structure has been proposed as the power semiconductor device for achieving the characteristics.

The FS layer structure has an impurity concentration higher than the drift layer and has a gentle concentration gradient such that the depletion layer does not reach the cathode of the diode (the collector of the IGBT) when the semiconductor device is turned off. In addition, in the FS layer structure, a region with the same conduction type as the drift layer is provided on the cathode side of the drift layer (the collector side in the IGBT). The use of the FS layer structure makes it possible to prevent punch-through when an off-voltage is applied. When the FS layer structure is used, it is possible to obtain the same breakdown voltage as that in a semiconductor device without the FS layer structure even though the thickness of the drift layer is small. As a result, it is possible to reduce the on-voltage. In addition, since the thickness of the drift layer is small, the number of excess carriers in the drift layer is reduced. Therefore, it is possible to reduce the reverse recovery loss of the diode (turn-off loss in the IGBT).

When the semiconductor device with the FS layer structure is manufactured (produced), the following method has been used as a method for preventing the breaking of a wafer during a wafer process. A thick wafer is put to the wafer process. First, a semiconductor function region (including an aluminum (Al) electrode film) required for a device is formed on the front surface of the wafer. Then, the rear surface of the wafer is ground such that the thickness of the wafer is reduced to a value substantially equal to that in the finish process. Then, n-type impurity ions, such as phosphorus (P) ions or selenium (Se) ions, are implanted into the ground rear surface of the wafer to form an FS layer.

However, in this method, it is difficult to perform heat treatment for activating the FS layer after the ions are implanted into the rear surface of the wafer at a temperature equal to or higher than the deterioration temperature of the Al electrode film on the front surface of the wafer. Therefore, when the heat treatment for activating the FS layer needs to be performed at a temperature equal to or higher than the deterioration temperature of the Al electrode film on the front surface of the wafer, the Al electrode film needs to be formed on the front surface of the wafer with a small thickness (hereinafter, referred to as a thin wafer) after the FS layer is formed, that is, after the rear surface of the wafer is ground. As a result, the number of processes increases in the thin wafer state. Therefore, there is a concern that the wafer will be likely to be broken and yield will be reduced.

In order to solve the problem that the number of processes increases in the thin wafer state after the rear surface is ground, a new method has been developed which forms an FS layer structure including an n buffer layer (corresponding to the FS layer) that is obtained by changing a crystal defect formed in the drift layer by proton radiation into a donor. According to this method, it is possible to activate the FS layer at a temperature lower than the deterioration temperature of the Al electrode film. In addition, a diode or an IGBT has been proposed in which a broad buffer (BB) layer structure is provided in a drift layer in order to reduce the loss or oscillation of the diode or the IGBT (for example, see the following Patent Literature 1).

Next, the structure of the diode according to the related art will be described. FIG. 7 is a schematic cross-sectional view illustrating the structure of a general pin (p-intrinsic-n) diode according to the related art. FIG. 10 is a schematic cross-sectional view illustrating the structure of a pin diode including a BB layer structure according to the related art. FIG. 8 is a characteristic diagram illustrating an impurity concentration distribution taken along the line X-X' of FIGS. 7 and 10. In the BB layer structure, an n-type drift layer 2, which is a silicon semiconductor substrate (n⁻ semiconductor substrate) 1, includes a BB layer 7 (donor layer) with an impurity concentration distribution which has the maximum impurity concentration at a depth corresponding to near the center of the silicon semiconductor substrate and has an impurity gradient in which the impurity concentration is gently reduced in two directions, that is, toward both an anode region 4 and a cathode region 5. In FIGS. 7 and 10, the same reference numerals indicate portions with the same function. In FIGS. 7 and 10 and the cross-sectional views other than FIGS. 7 and 10, A indicates an anode terminal and a K indicates a cathode terminal.

A method of forming the BB layer 7 using proton radiation has been known as the method of forming the BB layer structure. This method performs proton ($H^+$) radiation having, as a range, a depth to near the center of the n-type drift layer 2 of the silicon semiconductor substrate 1 formed by an FZ (floating zone) and then performs a heat treatment to change a crystal defect formed by the proton radiation into a donor, thereby forming the BB layer 7. In addition, a method has been known which introduces oxygen ($O_2$) into an n-type drift layer during proton radiation and improves the impurity concentration and electron mobility of a BB layer when the crystal defect formed by the proton radiation is changed into a donor (for example, see the following Patent Literature 2).

Furthermore, a structure has been proposed in which a termination process is performed for a crystal defect formed by the implantation of hydrogen ions to reduce a leakage current or the peak intensity (hereinafter, referred to as DLTS signal peak intensity) of trap density measured by a deep level transient spectroscopy (DLTS) method is high in the crystal defect with a trap level generated by the hydrogen termination process (for example, see the following Patent Literature 3). In addition, a method has been proposed which introduce a vacancy into the wafer formed by the CZ (Czochralski) method using proton radiation, performed a heat treatment to diffuse oxygen to the outside, and forms a low-oxygen precipitation layer (for example, see the following Patent Literature 4).

CITATION LIST

Patent Literature 1: JP 2003-318412 A
Patent Literature 2: JP 2007-055352 A
Patent Literature 3: JP 2011-049300 A
Patent Literature 4: JP 2009-524227 T However, in the method in which the donor layer formed by the proton radiation is used as the FS layer or the BB layer, the crystal defect formed by the proton radiation is changed into a donor, thereby forming the donor layer. Therefore, as the impurity concentration of the donor layer increases, the number of crystal defects increases. As a result, an increase in the on-voltage or an increase in the leakage current is inevitable.

Patent Literature 2 discloses the preferred range of the heat treatment temperature after the proton radiation. However, there are some types of crystal defects and Patent Literature 2 does not disclose which type of defect is formed depending on the formation condition of the FS layer or the BB layer by proton radiation. In addition, Patent Literature 2 does not disclose which type of crystal defect formed by proton radiation contributes to forming the donor layer or the influence of the crystal defect on the on-voltage or the leakage current.

An object of the invention is to provide a semiconductor device and a method of manufacturing a semiconductor device capable of suppressing an increase in an on-voltage, in order to solve the above-mentioned problems of the related art. In addition, another object of the invention is to provide a semiconductor device and a method of manufacturing a semiconductor device capable of suppressing an increase in a leakage current, in order to solve the above-mentioned problems of the related art.

SUMMARY

In order to solve the above-mentioned problems and achieve objects of the invention, a semiconductor device according to an aspect of the invention has the following characteristics. The semiconductor device includes a donor layer which is obtained by changing a crystal defect formed in a first-conduction-type drift layer by proton radiation into a donor. The donor layer has an impurity concentration distribution that includes a first portion with a maximum impurity concentration and a second portion with a concentration gradient in which the impurity concentration is reduced to the same impurity concentration as that of the first-conduction-type drift layer at a predetermined rate in a direction from the first portion to both main surfaces of the first-conduction-type drift layer. The crystal defect is a composite crystal defect mainly caused by a vacancy, an oxygen atom, and a hydrogen atom.

In the semiconductor device according to the above-mentioned aspect of the invention, the crystal defect may include a first complex defect caused by the vacancy, the oxygen atom, and the hydrogen atom, a second complex defect caused by a divacancy, the vacancy, and a phosphorus atom, and a third complex defect caused by the vacancy and the oxygen atom.

In the semiconductor device according to the above-mentioned aspect of the invention, the trap level density of the first complex defect may be higher than the trap level density of the second complex defect.

In the semiconductor device according to the above-mentioned aspect of the invention, the signal intensity of the first complex defect measured by a deep level transient spectroscopy method may be higher than the signal intensity of the second complex defect measured by the deep level transient spectroscopy method.

In the semiconductor device according to the above-mentioned aspect of the invention, the trap level density of the first complex defect may be higher than two times the trap level density of the second complex defect.

In the semiconductor device according to the above-mentioned aspect of the invention, the signal intensity of the first complex defect measured by a deep level transient spectroscopy method may be higher than two times the signal intensity of the second complex defect measured by the deep level transient spectroscopy method.

In the semiconductor device according to the above-mentioned aspect of the invention, the trap level density of the third complex defect may be higher than the trap level density of the second complex defect and may be lower than the trap level density of the first complex defect.

In the semiconductor device according to the above-mentioned aspect of the invention, the signal intensity of the third complex defect measured by a deep level transient spectroscopy method may be higher than the signal intensity of the second complex defect measured by the deep level transient spectroscopy method and may be lower than the signal intensity of the first complex defect measured by a DLTS method.

In the semiconductor device according to the above-mentioned aspect of the invention, when the signal intensities of the first complex defect, the third complex defect, and the second complex defect measured by the deep level transient spectroscopy method are VOH, VO, and VV+VP, respectively, and the ratio of the third complex defect is variable, VOH:VO:VV+VP may be equal to or more than 2:1:1 and equal to or less than 2:2:1.

In the semiconductor device according to the above-mentioned aspect of the invention, the semiconductor device may be a pin diode including a first-conduction-type semiconductor region and a second-conduction-type semiconductor region which face each other with the first-conduction-type drift layer interposed therebetween and have a resistance lower than the first-conduction-type drift layer.

In the semiconductor device according to the above-mentioned aspect of the invention, the semiconductor device may be an insulated gate bipolar transistor that has a metal-oxide film-semiconductor insulated gate structure formed on one main surface of the first-conduction-type drift layer.

The semiconductor device according to the above-mentioned aspect of the invention may further include a second-conduction-type semiconductor region that is provided on one main surface of the first-conduction-type drift layer and a plurality of the donor layers that are provided at different depths in a depth direction of the first-conduction-type drift layer. It is assumed that a distance index indicating a distance of an end of a depletion layer, which is spread from a pn junction between the first-conduction-type drift layer and the second-conduction-type semiconductor region when the semiconductor device is turned off, from the pn junction is represented by the following Expression 1 and the thickness of the first-conduction-type drift layer is W0. In this case, a distance X of the donor layer which the depletion layer reaches first among the plurality of donor layers from the other main surface of the first-conduction-type drift layer may satisfy W0−1.5 L≤X≤W0−0.8 L.

$$L = \sqrt{\frac{BV\varepsilon_s}{q\left(\frac{J_F}{qv_{sat}} + N_{dm}\right)}}$$ [Expression 1]

(where BV: an element rated voltage
∈$_s$: the permittivity of a semiconductor
q: elementary charge
J$_F$: the density of an element rated current
v$_{sat}$: a carrier saturation velocity
N$_{dm}$: the average concentration of a first-dielectric-type drift layer)

In the semiconductor device according to the above-mentioned aspect of the invention, the distance X may satisfy W0−1.4 L≤X≤W0−0.9 L.

In the semiconductor device according to the above-mentioned aspect of the invention, the distance X may satisfy W0−1.3 L≤X≤W0−1.0 L.

In order to solve the above-mentioned problems and achieve objects of the invention, a method of manufacturing the semiconductor device according to another aspect of the invention has the following characteristics. First, proton radiation which has, as a range, a depth to near the center of a first-conduction-type semiconductor substrate which will be the first-conduction-type drift layer is performed for the first-conduction-type semiconductor substrate to form a crystal defect in the first-conduction-type semiconductor substrate. Then, a heat treatment is performed at a temperature of 300° C. to 450° for one minute to 300 minutes to change the crystal defect into a donor.

In order to solve the above-mentioned problems and achieve objects of the invention, a method of manufacturing the semiconductor device according to still another aspect of the invention has the following characteristics. First, proton radiation which has, as a range, a depth closer to a rear surface than near the center of a first-conduction-type semiconductor substrate which will be the first-conduction-type drift layer is performed for the first-conduction-type semiconductor substrate to form a crystal defect in the first-conduction-type semiconductor substrate. Then, a heat treatment is performed at a temperature equal to or higher than 300° C. and equal to or lower than 450° for one minute to 300 minutes to change the crystal defect into a donor.

In the method of manufacturing the semiconductor device according to the above-mentioned aspect of the invention, the temperature of the heat treatment may be equal to or higher than 350° C. and equal to or lower than 400° C.

In the method of manufacturing the semiconductor device according to the above-mentioned aspect of the invention, a proton dose in the proton radiation may be equal to or more than $7.0 \times 10^{11}$ atoms/cm$^2$ and equal to or less than $5.0 \times 10^{13}$ atoms/cm$^2$, and the temperature of the heat treatment may be 350° C.±10° C.

In the method of manufacturing the semiconductor device according to the above-mentioned aspect of the invention, the proton dose in the proton radiation may be equal to or more than $7.0 \times 10^{11}$ atoms/cm$^2$ and equal to or less than $2.5 \times 10^{13}$ atoms/cm$^2$.

In the method of manufacturing the semiconductor device according to the above-mentioned aspect of the invention, the proton dose in the proton radiation may be equal to or more than $1.0 \times 10^{12}$ atoms/cm$^2$ and equal to or less than $1.0 \times 10^{13}$ atoms/cm$^2$.

In the method of manufacturing the semiconductor device according to the above-mentioned aspect of the invention, a proton dose in the proton radiation may be equal to or more than $5.0 \times 10^{11}$ atoms/cm$^2$ and equal to or less than $5.0 \times 10^{14}$ atoms/cm$^2$, and the temperature of the heat treatment may be equal to or higher than 380° C. and equal to or lower than 450° C.

In the method of manufacturing the semiconductor device according to the above-mentioned aspect of the invention, the proton dose in the proton radiation may be equal to or more than $7.0 \times 10^{11}$ atoms/cm$^2$ and equal to or less than $3.0 \times 10^{14}$ atoms/cm$^2$.

In the method of manufacturing the semiconductor device according to the above-mentioned aspect of the invention, the proton dose in the proton radiation may be equal to or more than $1.0 \times 10^{12}$ atoms/cm$^2$ and equal to or less than $3.0 \times 10^{14}$ atoms/cm$^2$.

In the method of manufacturing the semiconductor device according to the above-mentioned aspect of the invention, the proton dose in the proton radiation may be equal to or more than $3.0 \times 10^{12}$ atoms/cm$^2$ and equal to or less than $3.0 \times 10^{14}$ atoms/cm$^2$.

In the method of manufacturing the semiconductor device according to the above-mentioned aspect of the invention, the proton dose in the proton radiation may be equal to or more than $1.0 \times 10^{13}$ atoms/cm$^2$ and equal to or less than $1.0 \times 10^{14}$ atoms/cm$^2$.

In the method of manufacturing the semiconductor device according to the above-mentioned aspect of the invention, the temperature of the heat treatment may be equal to or higher than 390° C. and equal to or lower than 420° C.

In the method of manufacturing the semiconductor device according to the above-mentioned aspect of the invention, a distance index L indicating a distance of an end of a depletion layer, which is spread from a pn junction between the first-conduction-type drift layer and a second-conduction-type semiconductor region that is provided on one main surface of the first-conduction-type drift layer when the semiconductor device is turned off, from the pn junction may be represented by the following Expression 2. The acceleration energy of a proton in the proton radiation may be determined on the basis of the distance index L.

$$L = \sqrt{\frac{BV\varepsilon_s}{q\left(\frac{J_F}{qv_{sat}} + N_{dm}\right)}}$$ [Expression 2]

(where BV: an element rated voltage
∈$_s$: the permittivity of a semiconductor
q: elementary charge
J$_F$: the density of an element rated current
v$_{sat}$: a carrier saturation velocity
N$_{dm}$: the average concentration of a first-dielectric-type drift layer)

According to embodiments of the invention, the composite crystal defect which is mainly caused by the vacancy, the oxygen atom, and the hydrogen atom is formed in the drift layer by proton radiation. Therefore, even when the density of the crystal defects formed by the proton radiation is increased in order to increase the impurity concentration of the donor layer, it is possible to effectively change a large number of main crystal defects into donors with a high rate.

As a result, it is possible to form the donor layer which is little affected by an increase in the on-voltage or an increase in the leakage current in the drift layer.

ADVANTAGEOUS EFFECTS OF EMBODIMENTS

According to the semiconductor device and the method of manufacturing the semiconductor device for embodiments of the invention, it is possible to suppress an increase in the on-voltage. In addition, according to the semiconductor device and the method of manufacturing the semiconductor device for embodiments of the invention, it is possible to suppress an increase in the leakage current.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 18 is a table illustrating the position conditions of an n-type BB region which a depletion layer reaches first in the semiconductor device according to embodiments of the invention.

FIG. 19 is a cross-sectional view illustrating the state of the semiconductor device shown in FIG. 14 which is being manufactured.

DESCRIPTION OF EMBODIMENTS

Figure 1:
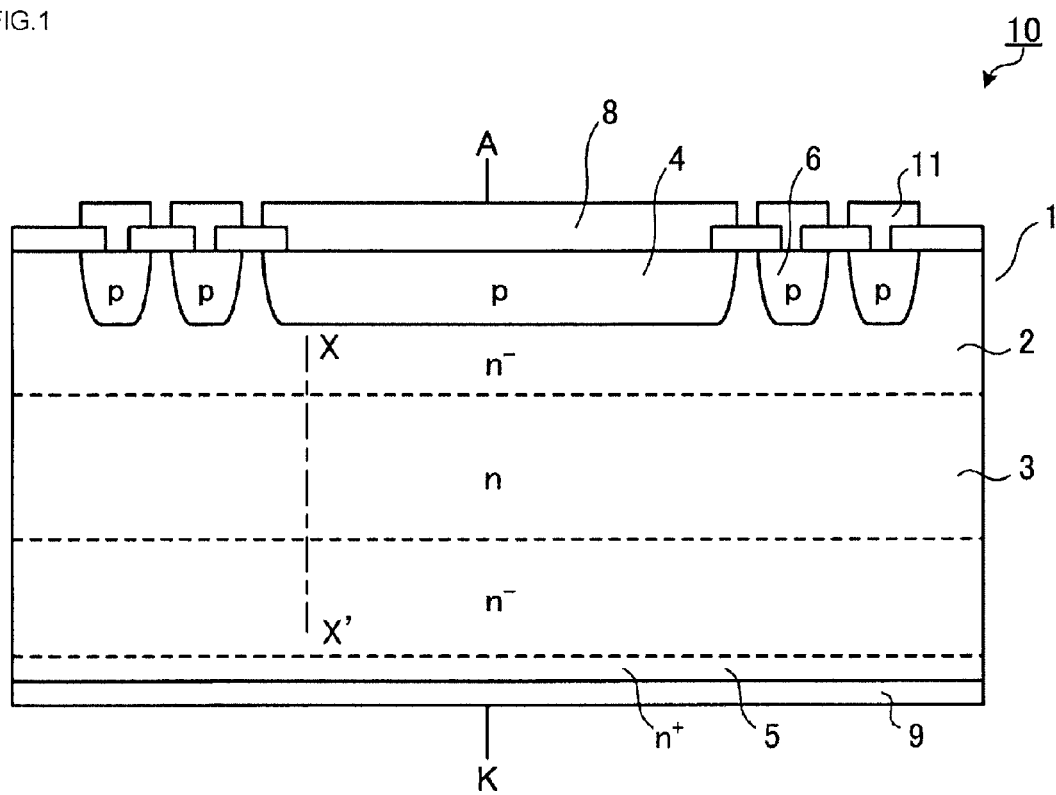
FIG. 1 is a schematic cross-sectional view illustrating the structure of a semiconductor device according to embodiments of the invention.

Reference will now be made in detail to the embodiments, examples of which are illustrated in the accompanying drawings, wherein like reference numerals refer to the like elements throughout. The embodiments are described below to explain the present invention by referring to the figures.

Hereinafter, a semiconductor device and a method of manufacturing a semiconductor device according to exemplary embodiments of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. The invention is not limited to the following embodiments as long as it does not depart from the scope and spirit thereof.

Figure 9:
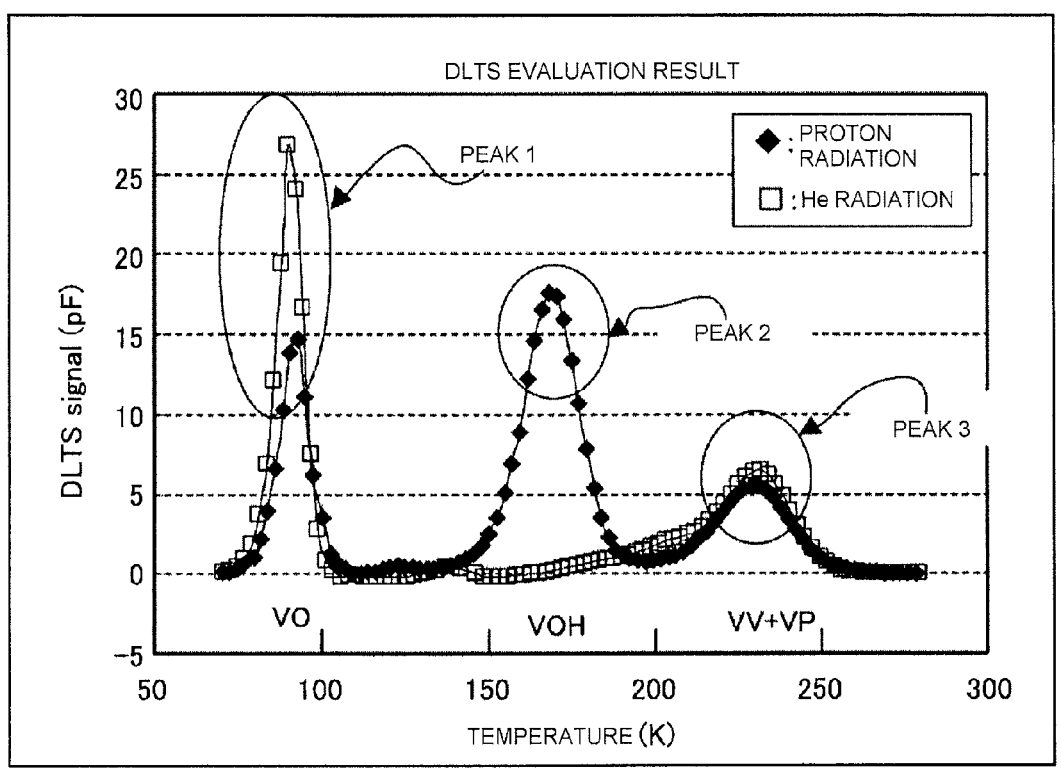
FIG. 9 is a characteristic diagram illustrating a DLTS spectrum waveform of the semiconductor device according to embodiments of the invention after proton radiation.
Figure 10:
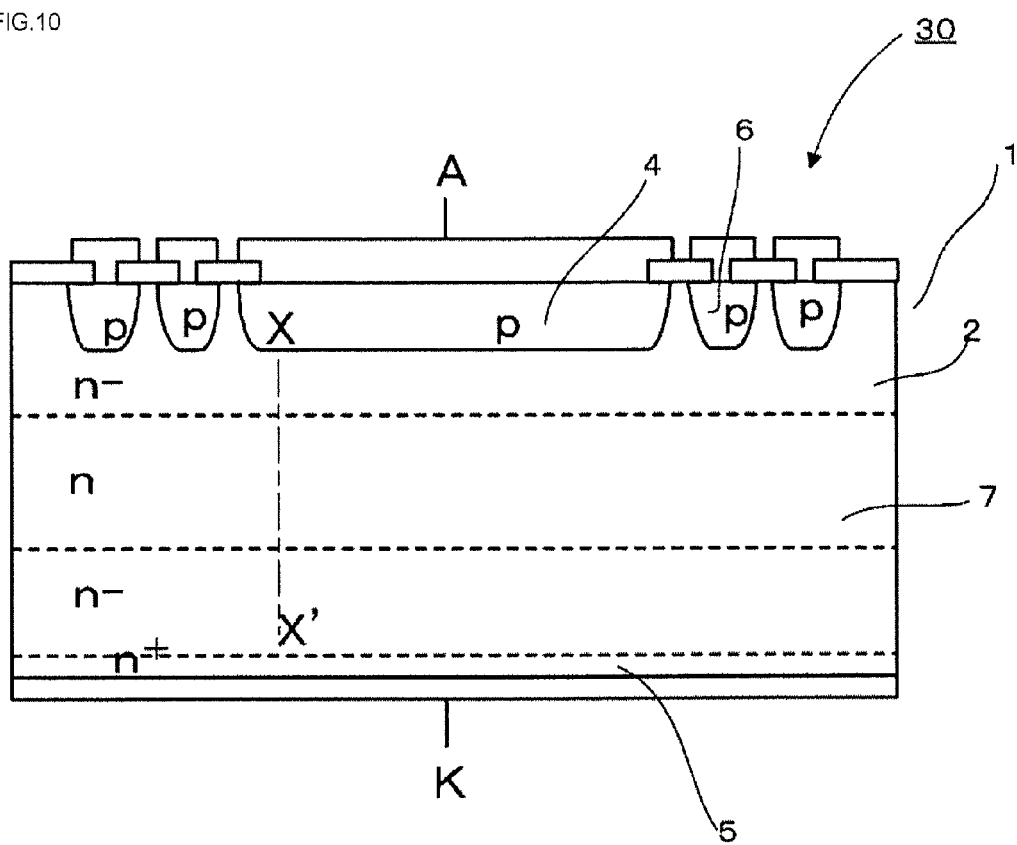
FIG. 10 is a schematic cross-sectional view illustrating the structure of a pin diode with a BB layer structure according to the related art.

First, crystal defects formed by proton radiation will be described. FIG. 9 is a characteristic diagram illustrating a DLTS spectrum waveform of a semiconductor device according to embodiments of the invention after proton radiation. FIG. 9 shows a spectrum waveform (mark ♦) when the details of the crystal defect formed by proton radiation for forming an FS layer of the semiconductor device according to embodiments of the invention, which will be described below, are measured by a DLTS (Deep Level Transient Spectroscopy) method. In addition, FIG. 9 shows a spectrum waveform (mark □) obtained by the DLTS method when helium (He) radiation is performed under the same conditions as the proton radiation. After the proton radiation, a heat treatment was performed at a temperature of 350° C. for one hour.

In FIG. 9, the horizontal axis is an absolute temperature (K) and indicates the depth of the trap level of the crystal defect formed in a silicon substrate. The depth of the trap level increases from the left side to the right side of FIG. 9. A DLTS signal (DLTS signal intensity) on the vertical axis indicates a capacitance variation ($\Delta F$). The peak waveforms represented by peaks 1, 2, and 3 indicate the trap density of the crystal defect, that is, crystal defect density at each trap level which is measured on the basis of the capacitance variation (ΔF). In addition, as peak intensity (DLTS signal peak intensity) increases, the trap density increases, that is, the total number of crystal defects increases (which holds for the horizontal axis and the vertical axis in FIGS. 3 and 11).

As can be seen from the result shown in FIG. 9, as described above, three peaks 1, 2, and 3 have been found in the proton radiation. The inventors have found that peak 1 is a VO complex defect caused by a vacancy (V) and an oxygen (O) atom, peak 2 is a VOH complex defect caused by the vacancy (V), the oxygen (O) atom, and a hydrogen (H) atom, and peak 3 is a (VV+VP) complex defect caused by a divacancy (VV), the vacancy (V), and a phosphorus (P) atom. In the helium radiation, peak 1 (VO complex defect) caused by the vacancy and oxygen and peak 3 (VV+VP complex defect) caused by the divacancy, the vacancy, and phosphorus have been found, but peak 2 has not been found.

As such, in the proton radiation, as described above, peak 2 (VOH complex defect) caused by the vacancy, oxygen, and hydrogen can be found as a high clear peak in FIG. 9, unlike the helium irradiation. In addition, the inventors have found that, among the three crystal defects, only the VOH complex defect caused by the vacancy, oxygen, and hydrogen indicated by peak 2 contributes as a donor source. In addition, the contribution of peak 2 as the donor source can be known from the fact that there is little VOH complex defect represented by peak 2 among the crystal defects formed by helium radiation as shown in FIG. 9 and the fact that the change of the defect into the donor does not occur in the helium radiation unlike the proton radiation.

From the above-mentioned results, the inventors found that the formation of crystal defects under the conditions that peak 2 (VOH complex defect) was a main component was effective in changing a defect into a donor with high efficiency, that is, obtaining a donor layer which was little affected by an increase in an on-voltage or an increase in a leakage current. In addition, the inventors found that, when the peak value of the DLTS signal intensity of the VV+VP complex defect was less than the peak value of the DLTS signal intensity of the VOH complex defect and the VO complex defect, it was possible to increase peak concentration (hereinafter, referred to as donor peak concentration) in the concentration distribution of the donor layer, reduce the leakage current, and reduce the on-voltage, which will be described below.

Embodiment 1

The structure of a semiconductor device according to embodiments of the invention will be described. FIG. 1 is a schematic cross-sectional view illustrating the structure of the semiconductor device according to the embodiments of the invention. The semiconductor device shown in FIG. 1 is a pin diode 10 including a BB layer which is a donor layer 3 formed by proton radiation. Specifically, the donor layer 3 is provided at a depth corresponding to near the center of an n-type drift layer 2 which is a silicon semiconductor substrate (n⁻ semiconductor substrate) 1. When the donor layer 3 is formed, first, a crystal defect is formed in the n-type drift layer 2, which is the silicon semiconductor substrate 1, by proton radiation. In Example 1 which will be described below, a proton dose was $1\times10^{12}$ (atoms/cm$^2$) and acceleration energy was 8 MeV (hereinafter, referred to as proton radiation conditions of this embodiment). After the proton radiation, a heat treatment is performed to change the crystal defect into a donor and the donor layer 3 formed by changing the crystal defect into the donor is used as an FS layer to form the pin diode 10.

In FIG. 1, A indicates an anode terminal, K indicates a cathode terminal, reference numerals 4 and 5 indicate an anode region and a cathode region, respectively, and reference numerals 8 and 9 indicate an anode electrode and a cathode electrode, respectively. Reference numerals 6 and 11 indicate termination structures, such as guard rings or field plates. The heat treatment (annealing) required to change the crystal defect into the donor may be performed, for example, at a temperature of about 300° C. to 450° C. for one minute to 300 minutes. In Example 1 which will be described below, annealing was performed at a temperature of 350° C. for one hour (hereinafter, referred to as annealing under the conditions of this embodiment).

Figure 2:
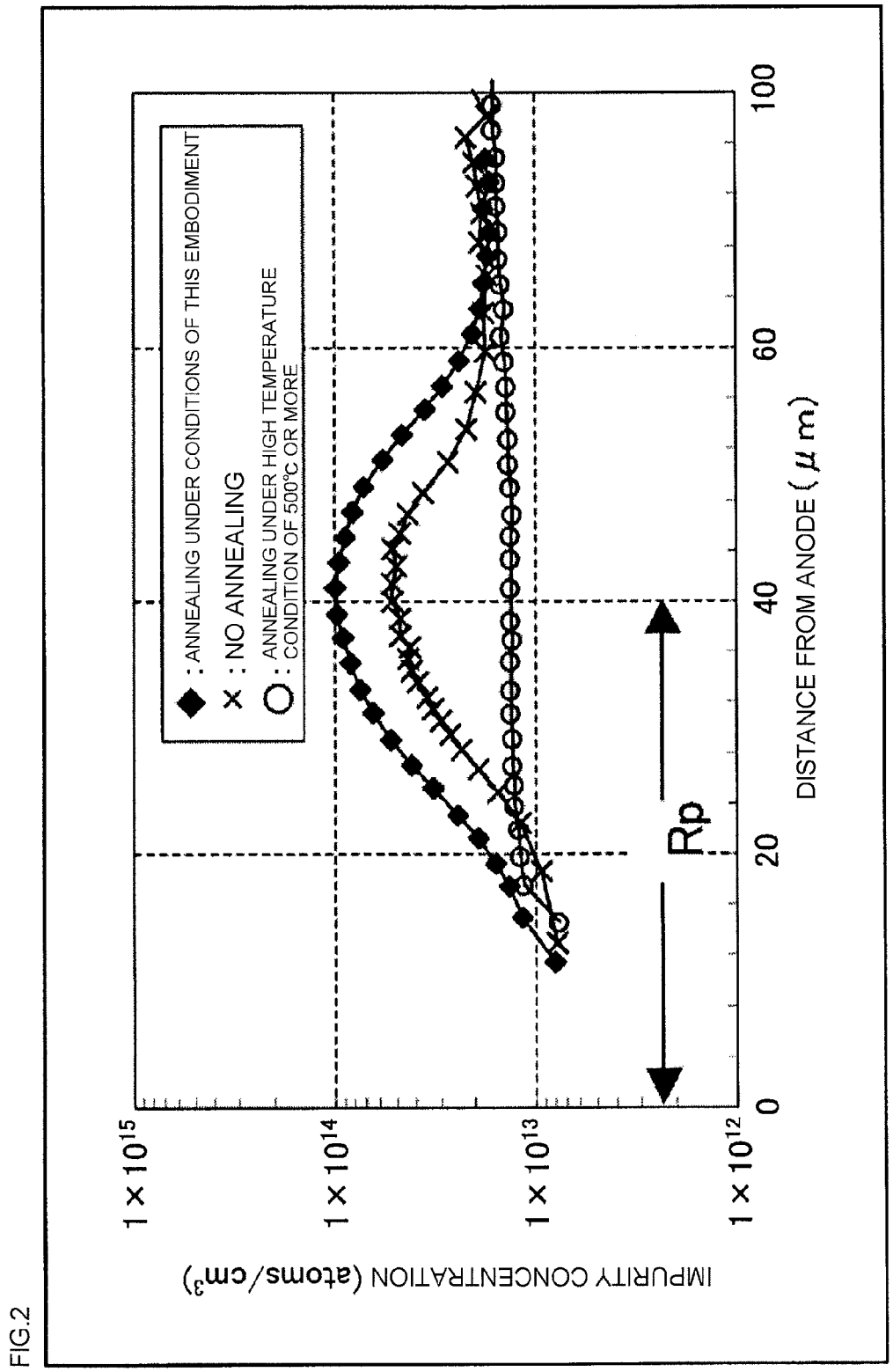
FIG. 2 is a characteristic diagram illustrating the impurity concentration distribution of a donor layer in an X-X' direction of FIG. 1.

Next, the impurity concentration distribution of the donor layer 3 will be described. FIG. 2 is a characteristic diagram illustrating the impurity concentration distribution of the donor layer 3 in the X-X' direction of FIG. 1. The impurity concentration distribution is obtained by a DLTS (Deep Level Transient Spectroscopy) method or a C-V (Current-Voltage) method which will be described below. In FIG. 2, the vertical axis indicates the impurity concentration (atoms/cm$^3$) of the donor layer 3 and the horizontal axis indicates the distance (μm) from the interface between the anode region 4 and the anode electrode 8, that is, the depth from the front surface (anode-side surface) of the silicon semiconductor substrate 1.

FIG. 2 shows the impurity concentration distribution of the silicon semiconductor substrate 1 according to Example 1, that is, the impurity concentration distribution of the silicon semiconductor substrate 1 when annealing is performed under the conditions of this embodiment (annealing under the conditions of this embodiment). In addition, FIG. 2 shows the impurity concentration distributions of the silicon semiconductor substrate when a heat treatment (annealing) is not performed after proton radiation (hereinafter, referred to as no annealing) and when a heat treatment (annealing) is performed at a high temperature of 500° C. or more (hereinafter, referred to as annealing under a high temperature condition of 500° C. or more) as comparative examples.

As can be seen from FIG. 2, each crystal defect that is formed around the position of a range Rp from the front surface (anode-side surface) of the silicon semiconductor substrate 1 by proton radiation is changed into a donor when no annealing is performed and when annealing is performed under the conditions of this embodiment, and is recovered and is not changed into a donor when annealing is performed under a high temperature condition of 500° C. or more.

When proton radiation is performed under the conditions of this embodiment and annealing is performed under the conditions of this embodiment, the donor layer 3 has the maximum impurity concentration at a depth corresponding to the range Rp of proton radiation from the front surface (anode-side surface) of the silicon semiconductor substrate 1 and the impurity concentration of the donor layer 3 has a concentration gradient in which it is gently inclined from the maximum value to the anode region 4 and the cathode region 5.

Embodiment 2

Figure 3:
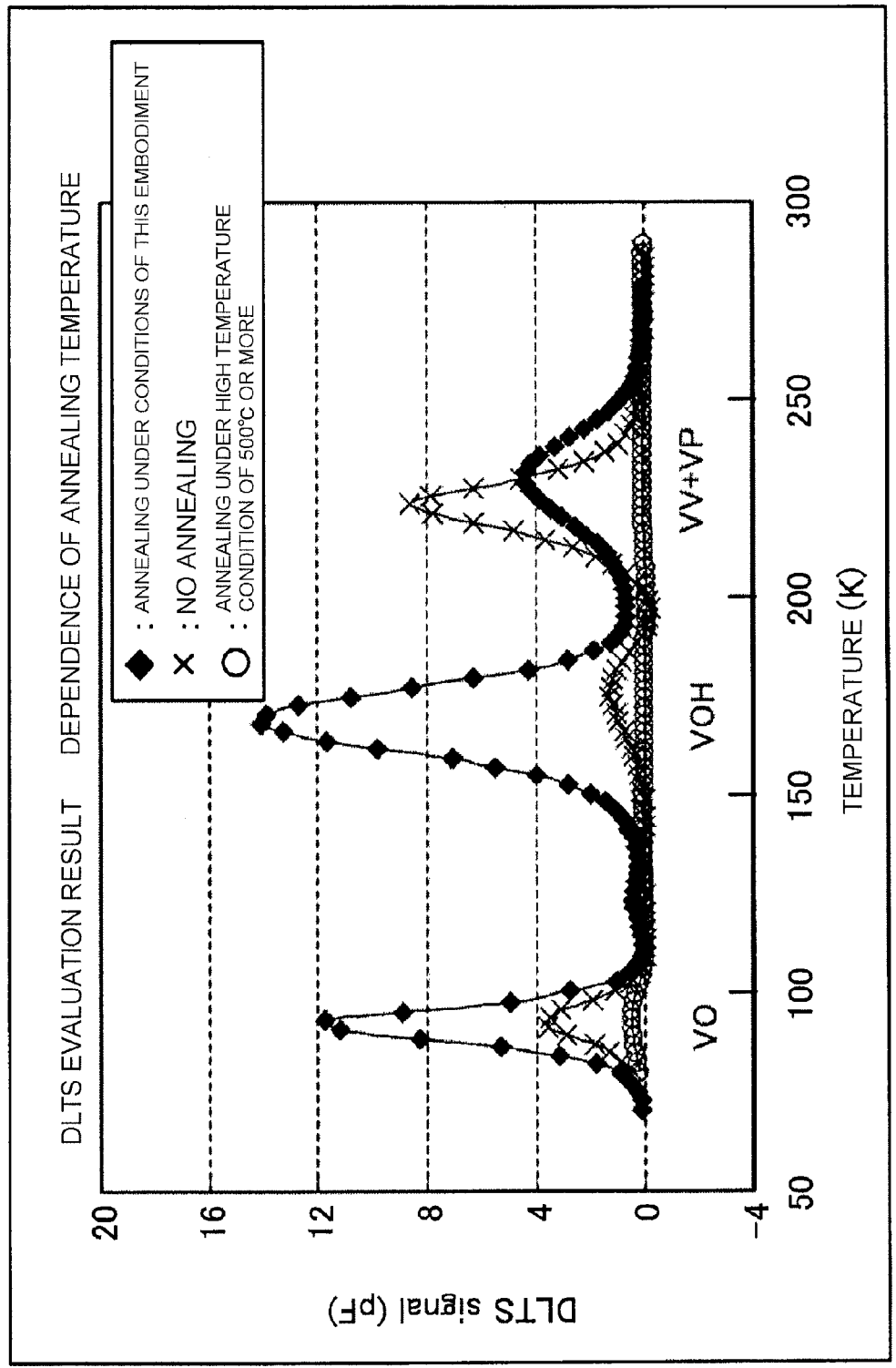
FIG. 3 is a characteristic diagram illustrating a DLTS spectrum waveform of a semiconductor device according to Example 1 after proton radiation.
Figure 4:
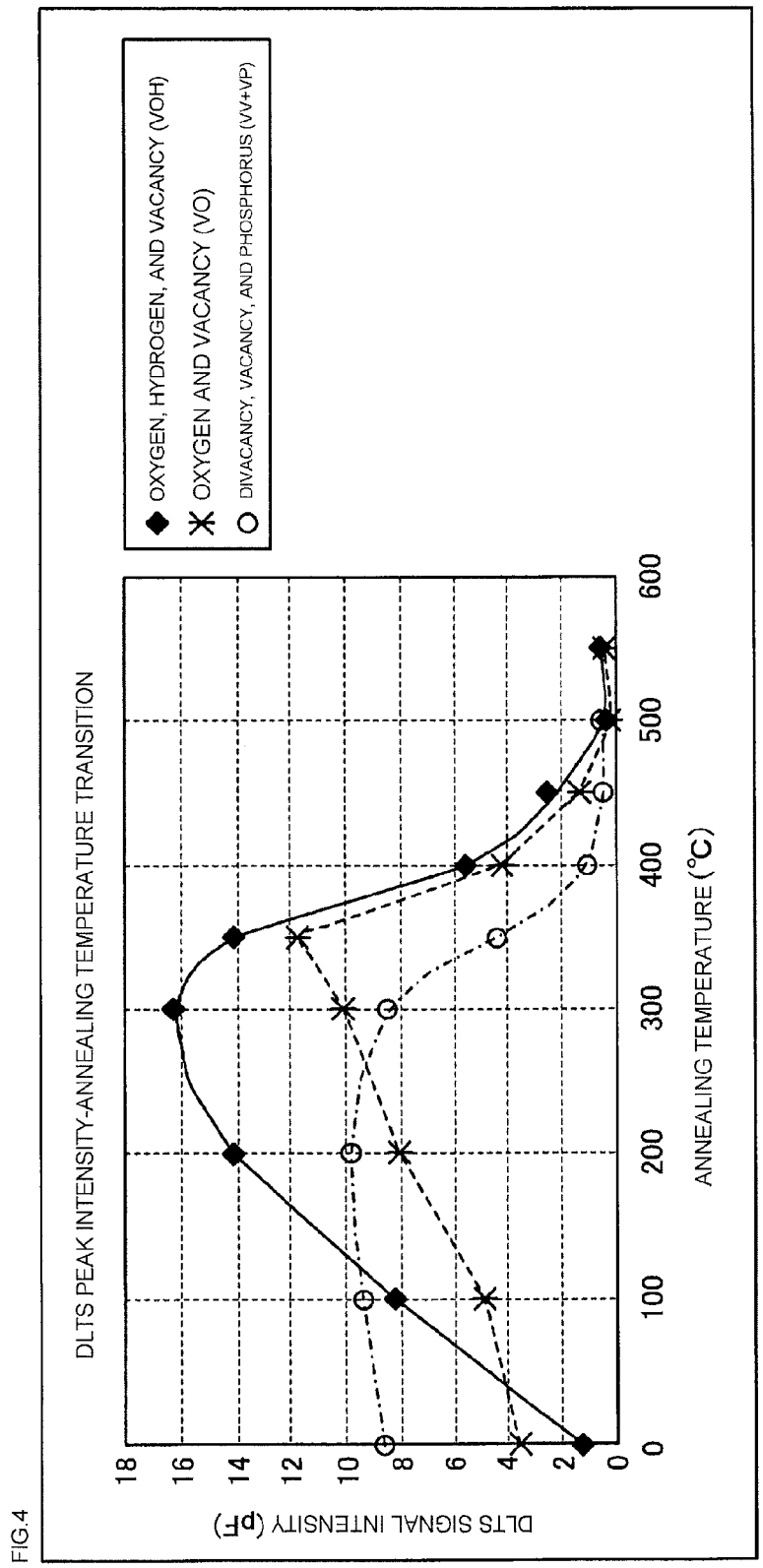
FIG. 4 is a characteristic diagram illustrating the relationship between the peak intensity of a DLTS signal and an annealing temperature after proton radiation in the semiconductor device according to Example 1.
Figure 5:
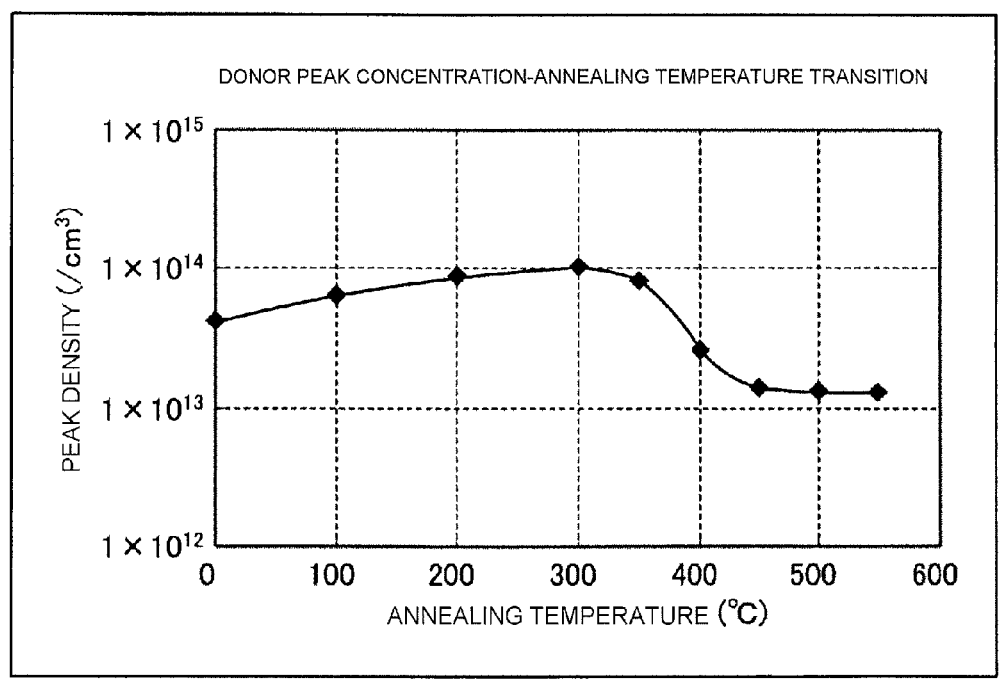
FIG. 5 is a characteristic diagram illustrating the relationship between donor peak concentration and the annealing temperature after proton radiation in the semiconductor device according to Example 1.

Next, the relationship between the peak intensity of a DLTS signal and an annealing temperature and the relationship between donor peak concentration and the annealing temperature when annealing is performed under the conditions of this embodiment, when no annealing is performed, and when annealing is performed under a high temperature condition of 500° C. or more. FIG. 3 is a characteristic diagram illustrating a DLTS spectrum waveform of a semiconductor device according to Example 1 after proton radiation. FIG. 4 is a characteristic diagram illustrating the relationship between the annealing temperature and the peak intensity of the DLTS signal after proton radiation in the semiconductor device according to Example 1. FIG. 5 is a characteristic diagram illustrating the relationship between the annealing temperature and the donor peak concentration after proton radiation in the semiconductor device according to Example 1.

FIG. 3 shows the spectrum waveform which is the DLTS measurement result under each of the above-mentioned heat treatment conditions. FIGS. 4 and 5 show the relationship between the peak intensity of each DLTS signal and the annealing temperature and the relationship between the donor peak concentration and the annealing temperature under the detailed heat treatment temperature conditions, as well as the heat treatment temperature under each of the heat treatment conditions. In FIGS. 3 to 5, data at an annealing temperature of 0° C. on the horizontal axis does not mean that annealing is performed at 0° C., but means that annealing is not performed at a temperature higher than room temperature (20° C. to 30° C.) (which holds for the other drawings).

Figure 13:
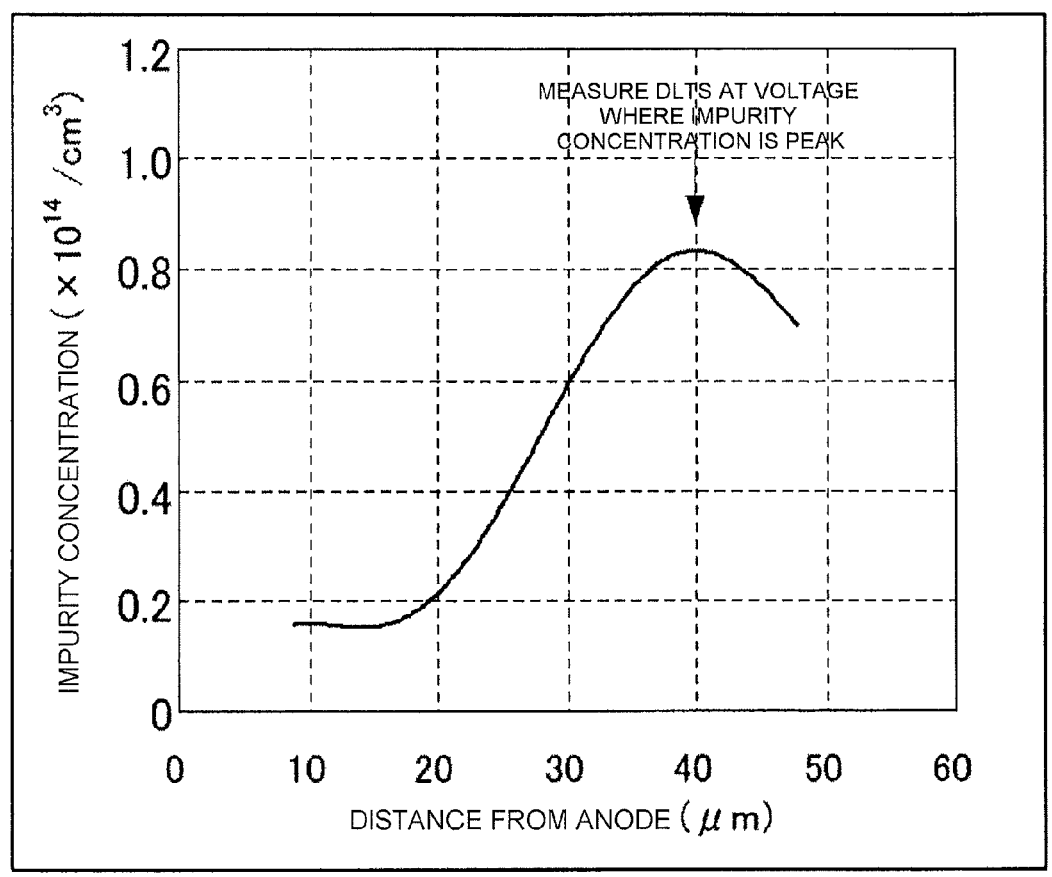
FIG. 13 is a characteristic diagram illustrating DLTS measurement conditions.

The DLTS spectrum waveform is acquired under the conditions shown in FIG. 13. FIG. 13 is a characteristic diagram illustrating DLTS measurement conditions. FIG. 13 shows the distribution of carrier concentration (that is, impurity concentration) obtained by the C-V method or the DLTS method, depending on the distance from the anode region 4. The C-V method or the DLTS method increases the voltage applied to the semiconductor device and measures the impurity concentration at the position of the end of the depletion layer which is spread depending on the voltage. As shown in FIG. 13, the DLTS spectrum waveform is acquired by the voltage at the position (peak position) where the impurity concentration is the maximum. The DLTS spectrum waveform is acquired by changing (sweeping) the temperature of the element to be measured from a very low temperature (a few K; K is Kelvin and is an absolute temperature) to a temperature close to room temperature (for example, 300 K) according to the known DLTS method.

The DLTS method observes a transient change (the phenomenon of emitting carriers from the trap) in the capacitance of the depletion layer when a pulsed voltage is applied, while changing (sweeping) the temperature, thereby measuring energy for activating the trap with a deep level, a capture cross-section, and the trap density of a crystal defect. The DLTS method uses that the carrier emission time (time constant) is a function of temperature. In the DLTS method, the time range (time constant) to be measured is fixed and the temperature is increased from a very low temperature (low temperature obtained from, for example, liquid helium or liquid nitrogen). Then, a capacitance difference (DLTS signal ($\Delta F$)) depending on the temperature difference (K) when the temperature is swept is plotted to obtain a curve which is called a DLTS spectrum with a peak value corresponding to the depth (the energy level from the center of the energy gap) of the trap level.

As can be seen from FIG. 3, in the same proton radiation, the type of main crystal defect varied depending on the conditions of the subsequent heat treatment. The result shown in FIG. 3 proved that the number of VV+VP complex defects caused by a divacancy (VV), a vacancy (V), and phosphorus (P) was the largest when no annealing (mark x) was performed, the number of VOH complex defects caused by a vacancy (V), oxygen (O), and hydrogen (H) was the largest when annealing (mark ♦) was performed under the conditions of this embodiment, and the DLTS signal peak intensity of the VOH complex defect was more than the DLTS signal peak intensity of the other defects. In addition, as can be seen from FIG. 3, the DLTS signal (DLTS signal intensity) ($\Delta F$) is approximately zero when annealing (mark ○) is performed under a high temperature condition of 500° C. or more and most of the crystal defects are removed by the heat treatment.

FIG. 4 shows the maximum intensity of each of the VOH complex defect, the VO complex defect, and the VV+VP complex defect with respect to DLTS signal intensity at an annealing temperature other than the conditions (350° C.) of this embodiment. In FIG. 4, an annealing temperature of 0° C. corresponds to the case in which no annealing is performed and an annealing temperature of 500° C. or more corresponds to the case in which annealing is performed at a high temperature condition of 500° C. or more. As can be seen from FIG. 2, when no annealing is performed (which is displayed at a position corresponding to 0° C.) and when annealing is performed under the conditions (350° C.) of this embodiment, the donor layer is formed. As can be seen from FIG. 4, the magnitude relationship among the maximum intensities of signals in three types of defects, that is, the ratio of the maximum intensities is different.

When no annealing is performed, the ratio of the maximum intensities of the DLTS signals is VOH:VO:VV+VP=0.5:2:4 and the VV+VP complex defect has the highest signal intensity. On the other hand, when annealing is performed under the conditions of this embodiment, the signal intensity of the VOH complex defect is the highest and the ratio is VOH:VO:VV+VP=2:1:1. That is, even though the donor layer is formed by proton radiation, the configuration of the density of the defects (trap levels) is different when no annealing is performed and when annealing is performed under the conditions of this embodiment. A difference in the configuration ratio of the DLTS signal intensity strongly appears in the characteristics which will be described below. It was confirmed that, when annealing was performed at a temperature higher than 350° C., the maximum intensity of the DLTS signal of each defect was reduced while the same ratio (2:1:1) as that when annealing was performed under the conditions of this embodiment was maintained. In the annealing performed under a high temperature condition of 500° C. or more, DLTS signal intensity is zero in any defect, which means that the number of defects is reduced.

FIG. 5 shows the relationship between the annealing temperature and the peak concentration (donor peak concentration) of the concentration distribution of the donor layer obtained by the C-V method or the DLTS method. As shown in FIG. 5, the donor peak concentration is the highest at an annealing temperature of 300° C. and is substantially equal to bulk crystal concentration at a temperature of 450° C. or more. In particular, it was confirmed that peak concentration when the annealing temperature was 300° C. was substantially equal to that when the annealing temperature was 350° C., was reduced to about one third of that when the annealing temperature was 400° C., and was equal to that when no annealing is performed.

Figure 6:
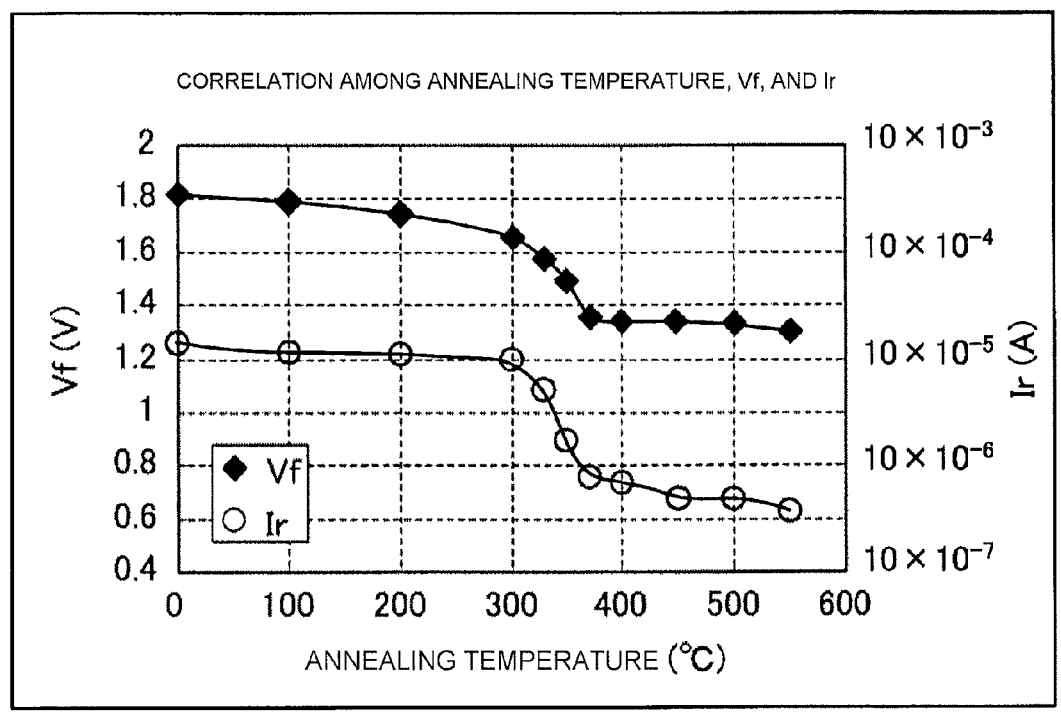
FIG. 6 is a characteristic diagram illustrating the relationship between Vf-Ir characteristics and the annealing temperature after proton radiation in the semiconductor device according to Example 1.
Figure 7:
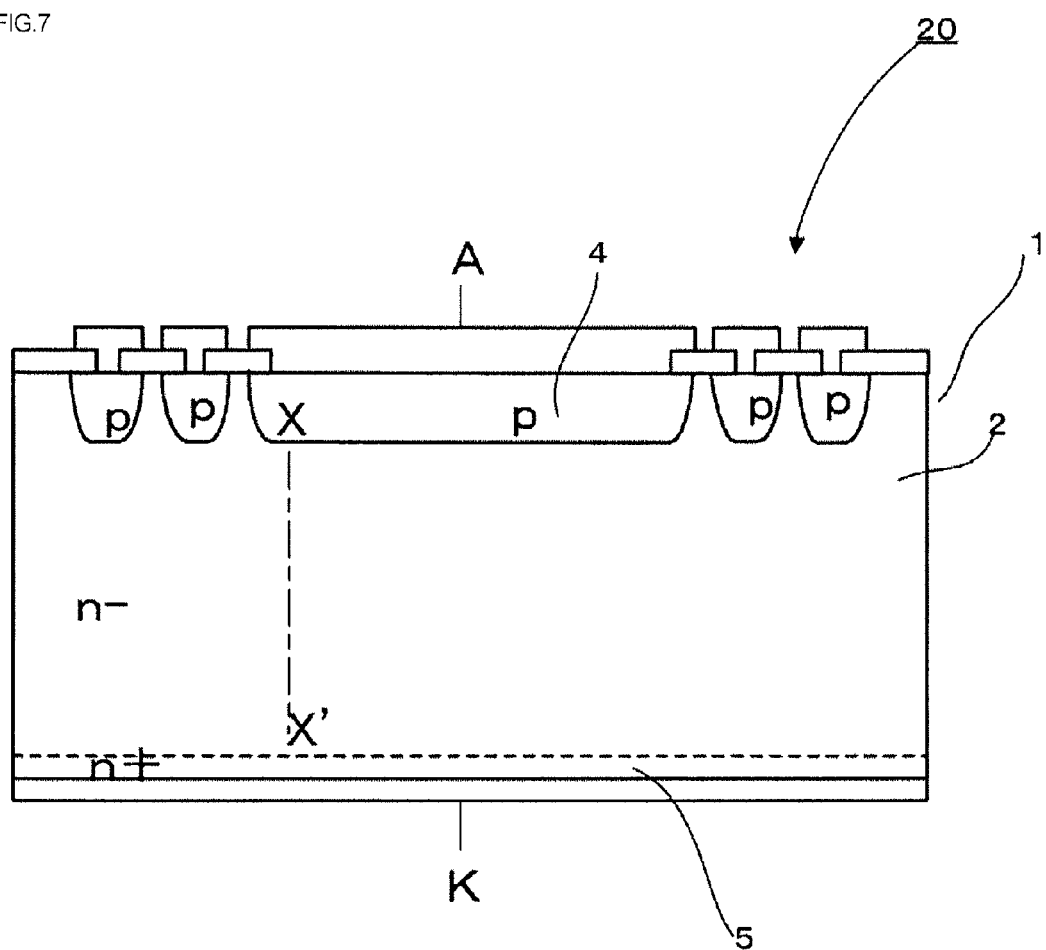
FIG. 7 is a schematic cross-sectional view illustrating the structure of a general pin diode according to the related art.
Figure 8:
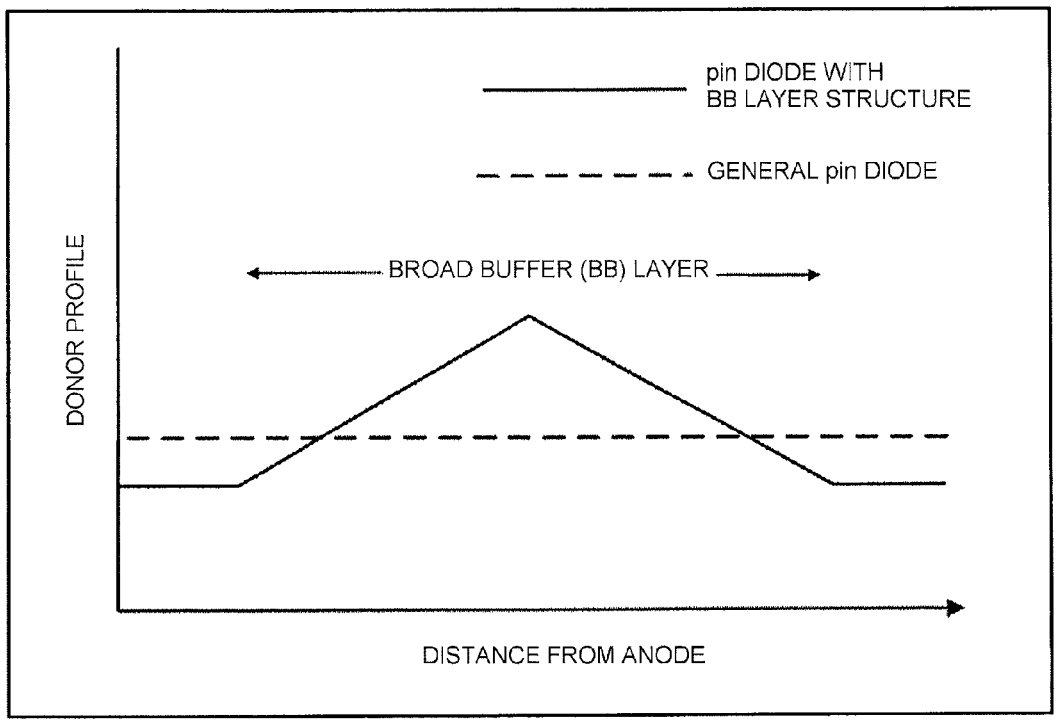
FIG. 8 is a characteristic diagram illustrating an impurity concentration distribution taken along the line X-X' of FIGS. 7 and 10.

The on-voltage Vf-leakage current Ir characteristics of the semiconductor device according to embodiments of the invention with respect to the annealing temperature after proton radiation were verified and the verification result was different from the results shown in FIGS. 4 and 5. FIG. 6 is a characteristic diagram illustrating the relationship between the annealing temperature and the Vf-Ir characteristics after proton radiation in the semiconductor device according to Example 1. FIG. 6 shows the on-voltage Vf when a forward current of a diode is 200 A/cm² and the leakage current Ir when a reverse bias of the diode is 600 V, with respect to the annealing temperature. As shown in FIG. 6, the on-voltage Vf and the leakage current Ir are both the maximum when no annealing is performed. The on-voltage Vf and the leakage current Ir are reduced when annealing is performed at a temperature of 300° C. or more. In particular, the rate of reduction in the on-voltage Vf and the leakage current Ir at a unit temperature is high in the temperature range of 300° C. to 400° C. In particular, the leakage current at an annealing temperature of 350° C. is reduced to about one third of the leakage current at an annealing temperature of 300° C. As such, the electrical characteristics tend to be different from the DLTS signal intensity and the donor peak concentration shown in FIGS. 4 and 5.

That is, the results shown in FIGS. 3 through 6 proved that, in order to increase the donor peak concentration and reduce the leakage current, it was necessary to control the ratio of the DLTS signal intensities of the VOH complex defect, the VO complex defect, and the VV+VP complex defect, in addition to increasing the concentration of oxygen or performing annealing at a high temperature. The reason why the leakage current Ir when no annealing is performed is different from that when annealing is performed at a temperature of 300° C. even though the donor peak concentration is high is that the DLTS signal intensity ratio of the VV+VP complex defect is relatively higher than that of the VOH complex defect and the VO complex defect, that is, trap level density is high. The reason why the donor peak concentration when annealing is performed at a temperature of 350° C. is substantially equal to the donor peak concentration when annealing is performed at a temperature of 300° C., but the leakage current Ir when annealing is performed at a temperature of 350° C. is reduced to about one third of that when annealing is performed at a temperature of 300° C. is that the DLTS signal intensity of the VV+VP complex defect is equal to or less than half the DLTS signal intensity of the VOH complex defect and the VO complex defect, particularly, the DLTS signal intensity of the VO complex defect is close to that of the VOH complex defect.

When the characteristics of embodiments of the invention are summarized from the above-mentioned results, it is preferable that a preferred embodiment have the following three characteristics:

(a) The DLTS signal intensity (that is, trap level density) of the VOH complex defect is the highest;

(b) The DLTS signal intensity (trap level density) of the VOH complex defect and the VO complex defect is higher than that of the VV+VP complex defect, preferably, is equal to or more than two times the DLTS signal intensity of the VV+VP complex defect; and (c) The ratio of the DLTS signal intensities of the VOH complex defect, the VO complex defect, and the VV+VP complex defect is as follows when the VO complex defect is seen as a parameter: VOH:VO:VV+VP is 2:1:1 and 2:2:1 and the ratio thereof is, for example, 2:1.2:1, 2:1.5:1, or 2:1.8:1.

According to embodiments of the invention, since the heat treatment is performed at a temperature equal to or higher than 300° C. and equal to or lower than 450° C. at which the VOH complex defect caused by vacancy (V), oxygen (O), and hydrogen (H) which contribute to changing a defect into a donor is the main crystal defect, the rate of changing a defect into a donor is improved and a large number of main crystal defects are changed into donors. Therefore, a forward voltage drop (on-voltage Vf) due to the crystal defect and the influence of the crystal defect on the leakage current Ir are reduced and a desired donor change condition is obtained. In particular, when the annealing temperature is equal to or higher than 350° C. and equal to or lower than 400° C., the ratio of the DLTS signal intensities (trap level densities) of VOH:VO:VV+VP have all of the above-mentioned characteristics (a), (b), and (c), which is preferable. It is more preferable that the annealing temperature be higher than 350° C. and lower than 400° C.

Embodiment 3

Next, a method of manufacturing the semiconductor device according to embodiments of the invention will be described in detail. In this embodiment, an example in which the pin diode with a breakdown voltage of 1200 V shown in FIG. 1 is manufactured will be described. An FZ-n-type silicon semiconductor substrate 1 (hereinafter, referred to as a wafer 1) with a resistivity of 90 Ωcm (a phosphorus concentration of $5.0 \times 10^{13}$ atoms/cm³) is prepared as the silicon semiconductor substrate. A heat treatment is performed in a nitrogen and oxygen atmosphere at a temperature of 1250° C. for 100 hours to thermally diffuse phosphorus to a depth of about 80 μm from both main surfaces of the wafer 1. The surface impurity concentration of a phosphorus diffusion layer formed in the wafer 1 is, for example, about $1.0 \times 10^{20}$ atoms/cm³. A large amount of oxygen is introduced from both surfaces of the wafer 1 into the wafer 1 by the heat treatment and the oxygen concentration of the wafer 1 becomes solubility limit concentration (about $1 \times 10^{18}$ atoms/cm³). Then, one main surface of the wafer 1 is ground to remove the phosphorus diffusion layer and mirror-like finishing is performed for both main surfaces of the wafer 1.

Then, for example, an anode region 4, an anode electrode 8, a guard ring 6, a field plate 11, and an interlayer insulating film are formed on the front surface of the wafer 1 subjected to mirror-like finishing by a standard diode process. The anode region 4 has an impurity concentration of, for example, $5 \times 10^{16}$ atoms/cm³ and a depth of, for example, 3 μm. In addition, the anode electrode 8 is made of, for example, an aluminum (Al) alloy (Al—Si1%) including aluminum and 1% of silicon.

Then, the wafer 1 is irradiated with proton which is accelerated by, for example, a cyclotron from the anode electrode 8. At that time, the acceleration energy of the cyclotron is, for example, 7.9 MeV and a proton dose is, for example, $1.0 \times 10^{12}$ atoms/cm². In addition, an aluminum absorber is used to adjust the thickness thereof such that the range Rp of the proton is 60 μm from the interface between the front surface of the wafer 1 and the anode electrode 8. Alternatively, for example, an electrostatic accelerator may be used to generate acceleration energy which enables the range Rp of the proton to be 60 μm and proton may be directly radiated, without using the aluminum absorber. In this case, the acceleration energy is 2.3 MeV. It is preferable that a proton dose be selected from the range of $1.0 \times 10^{11}$ atoms/cm² to $1.0 \times 10^{14}$ atoms/cm². FIG. 9 shows the spectrum waveform (mark ◆) obtained by measuring the crystal defects formed by the proton radiation using the DLTS method.

Then, a heat treatment (annealing) is performed in a hydrogen atmosphere at a temperature of, for example, 350° C. for one hour to recover some of the crystal defects represented by the spectrum waveform indicated by the mark ♦ in FIG. 9, thereby changing the crystal defects into donors. In this way, the high-concentration donor layer 3 is formed at a depth of about 60 μm from the interface between the front surface of the wafer 1 and the anode electrode 8. A desired BB layer is formed by the donor layer 3. The inventors have found that the heat treatment is preferably performed at a temperature of 300° C. to 400° C. for one minute to 300 minutes after the proton radiation. In addition, as can be seen from FIG. 4, the VV+VP complex defect remains in a region from the incident surface (front surface) of a proton to a portion of the donor layer 3 in which the proton is stopped at a heat treatment temperature of 300° C. to 400° C., particularly, at a heat treatment temperature of 350° C. Therefore, the lifetime of a minor carrier in the region through which the proton passes and the donor layer 3 is in the range of about 0.3 μs to 3.0 μs.

Then, grinding or wet etching is performed for the rear surface of the wafer 1 to reduce the thickness of the wafer 1 to a predetermined value, for example, 140 μm. Then, n-type impurity ions, such as phosphorus ions or arsenic (As) ions, are implanted into the rear surface of the wafer 1. At that time, acceleration energy is, for example, 50 keV and the dose is, for example, $1 \times 10^{15}$ atoms/cm$^2$. Then, the ion-implanted rear surface of the wafer 1 is irradiated with a laser beam from, for example, an SHG (second harmonic generation) YAG laser by a double pulse method which is a known technique. The double pulse method continuously radiates a plurality of pulsed laser beams from a plurality of laser irradiation devices to each laser beam irradiation area while shifting the irradiation timing by a predetermined delay time.

When the laser beams are radiated by the double pulse method, the total energy density of the laser beams for each irradiation area is, for example, 3 J/cm$^2$. In addition, the double pulse delay time is, for example, 300 nsec. The implanted n-type impurity ions, such as phosphorus ions or arsenic ions, are electrically activated by the laser irradiation and an n$^+$ cathode region 5 is formed on a surface layer of the rear surface of the wafer 1.

Finally, metal films are formed on the surface of the n$^+$ cathode region 5 in the order of, for example, titanium (Ti), nickel (Ni), and gold (Au) and a cathode electrode 9 which comes into ohmic contact with the n$^+$ cathode region 5 is formed. In this way, the pin diode according to embodiments of the invention exemplified FIG. 1 is completed.

As described above, the proton is not radiated from the front surface, but may be radiated from a ground and etched surface (rear surface). For example, the range of the proton may be 70 μm from the ground and etched surface in order to set the peak position of the donor layer 3 to 70 μm from the front surface. In this case, the acceleration energy of the proton is 2.5 MeV. However, the heat treatment temperature after the proton radiation is higher than the above-mentioned value. The reason is that, when the diode is reversely recovered, the carrier remains on the rear surface and the remaining carrier suppresses oscillation. That is, when the proton is radiated from the rear surface, the recombination of the carrier is accelerated since there is the VV+VP complex defect in the region in which the carrier remains. Therefore, the carrier is depleted during reverse recovery and oscillation is likely to occur. In the manufacture of the diode, when the proton is radiated from the ground and etched surface (rear surface), it is necessary to sufficiently reduce the number of VV+VP complex defects. In order to meet the requirements, as can be seen from FIG. 4, the heat treatment temperature is at least equal to or higher than at least 350° C. and, preferably, equal to or higher than 400° C.

In this case, the lifetime of the minor carrier in the region through which the proton passes and the donor layer 3 is about equal to or more than 3.0 μs and equal to or less than 30 μs.

Embodiment 4

Figure 11:
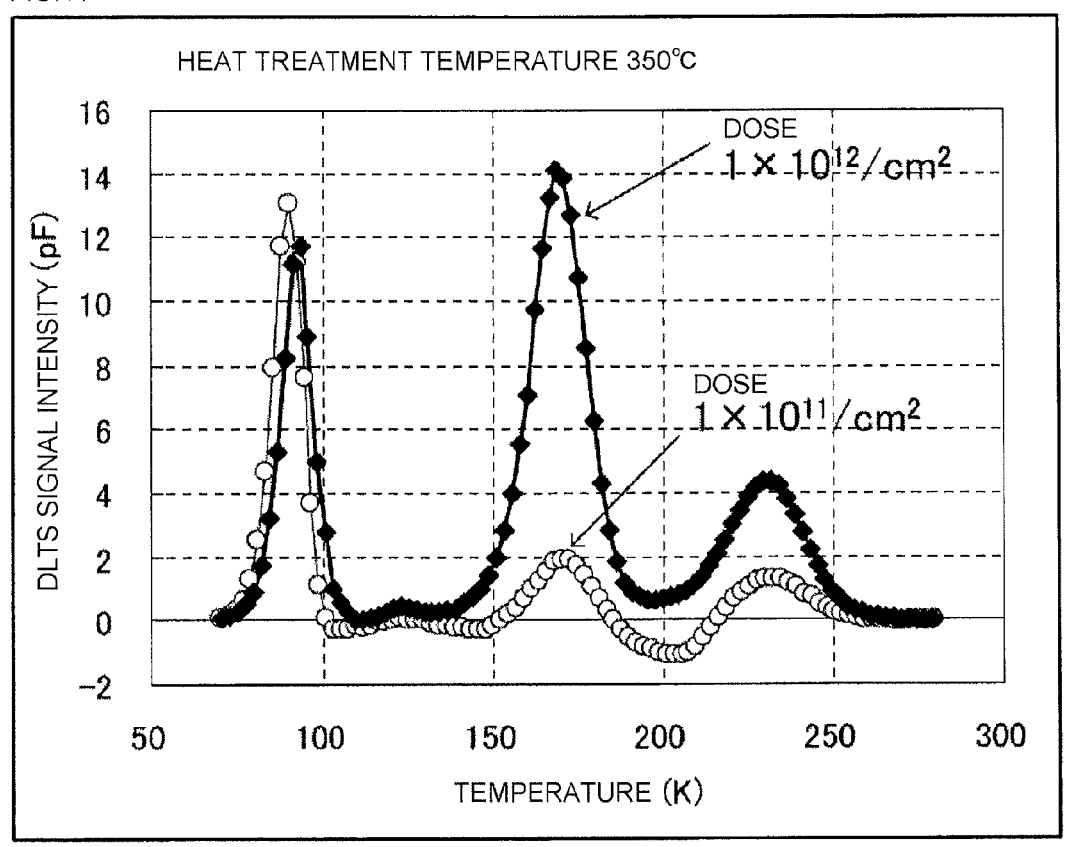
FIG. 11 is a characteristic diagram illustrating a DLTS spectrum waveform of a semiconductor device according to Example 2 after proton radiation.

Next, the relationship between the peak intensity of a DLTS signal and a proton dose will be described. FIG. 11 is a characteristic diagram illustrating a DLTS spectrum waveform of a semiconductor device according to Example 2 after proton radiation. In FIG. 11, the peak intensities of the DLTS signals of each defect are compared with each other when the proton dose is $1 \times 10^{11}$/cm$^2$ and $1 \times 10^{12}$/cm$^2$. In FIG. 11, the peaks indicate a VO complex defect, a VOH complex defect, and a W+VP complex defect in the ascending order of the temperature, similarly to FIGS. 3 and 9. In Example 2, the annealing temperature after proton radiation is 350° C. In Example 2, the configuration is the same as that in Example 1 except for a proton dose. The result shown in FIG. 11 proved that, when the dose was $1 \times 10^{11}$/cm$^2$, the peak intensity of the DLTS signal of the VOH complex defect was reduced to one fifth of that when the dose was $1 \times 10^{12}$/cm$^2$. As such, when the DLTS signal intensity (defect density, trap density) of the VOH complex defect is relatively low, the peak concentration of an FS layer is low, which is not preferable.

Figure 12:
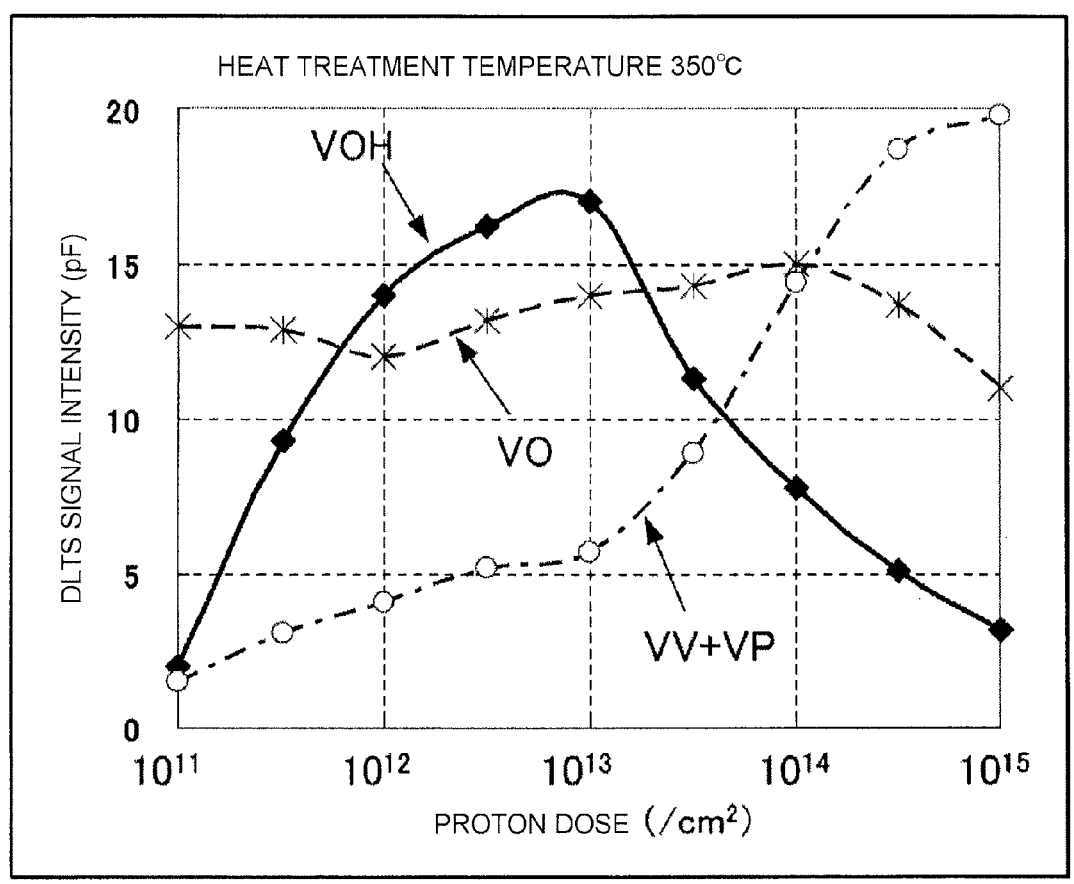
FIG. 12 is a characteristic diagram illustrating the relationship between a proton dose and DLTS signal intensity after proton radiation in the semiconductor device according to Example 2.

FIG. 12 is a characteristic diagram illustrating the relationship between the DLTS signal intensity and the proton dose after proton radiation in the semiconductor device according to Example 2. FIG. 12 shows the dependence of the DLTS signal intensity of each of the VOH complex defect, the VO complex defect, and the VV+VP complex defect on the proton dose. As can be seen from FIG. 12, when the proton dose is equal to or more than $7 \times 10^{11}$/cm$^2$ and equal to or less than $2.5 \times 10^{13}$/cm$^2$, the signal intensity of the VOH complex defect is higher than that of the VO complex defect or the VV+VP complex defect. In addition, when the proton dose is equal to or more than $1 \times 10^{12}$/cm$^2$ and equal to or less than $1 \times 10^{13}$/cm$^2$, the DLTS signal intensity of the VOH complex defect is definitely high, that is, it is possible to maximize the trap density (that is, defect density) of the VOH complex defect.

When the proton dose is more than $2.5 \times 10^{13}$/cm$^2$, first, the DLTS signal intensity of the VOH complex defect is less than the DLTS signal intensity of the VO complex defect. Therefore, the defect density or trap density of the VOH complex defect is reduced and the peak concentration of the FS layer is reduced. When the proton dose is more than $5 \times 10^{13}$/cm$^2$, the DLTS signal intensity of the VV+VP complex defect is higher than the DLTS signal intensity of the VOH complex defect. As such, when the signal intensity of the VV+VP complex defect is relatively high, that is, when the defect density or trap density thereof is high, for example, the amount of leakage current increases, which is not preferable.

When the proton dose is equal to or more than $7 \times 10^{11}$/cm$^2$, the signal intensity (defect/trap density) of the VV+VP complex defect is the lowest and the DLTS signal intensity (defect/trap density) of the VOH complex defect is the highest, as described above. Therefore, the leakage current is suppressed to a small value and an increase in the on-voltage is suppressed. The proton dose is preferably equal to or more than $7 \times 10^{11}$/cm$^2$ and equal to or less than $5 \times 10^{13}$/cm$^2$ and, more preferably, equal to or more than $7 \times 10^{11}$/cm$^2$ and equal to or less than $2.5 \times 10^{13}$/cm$^2$. The relationship between the DLTS signal intensity and the proton dose can be similarly reproduced when the heat treatment temperature is in the range of ±10° C. to 350° C.

Embodiment 5

Figure 14:
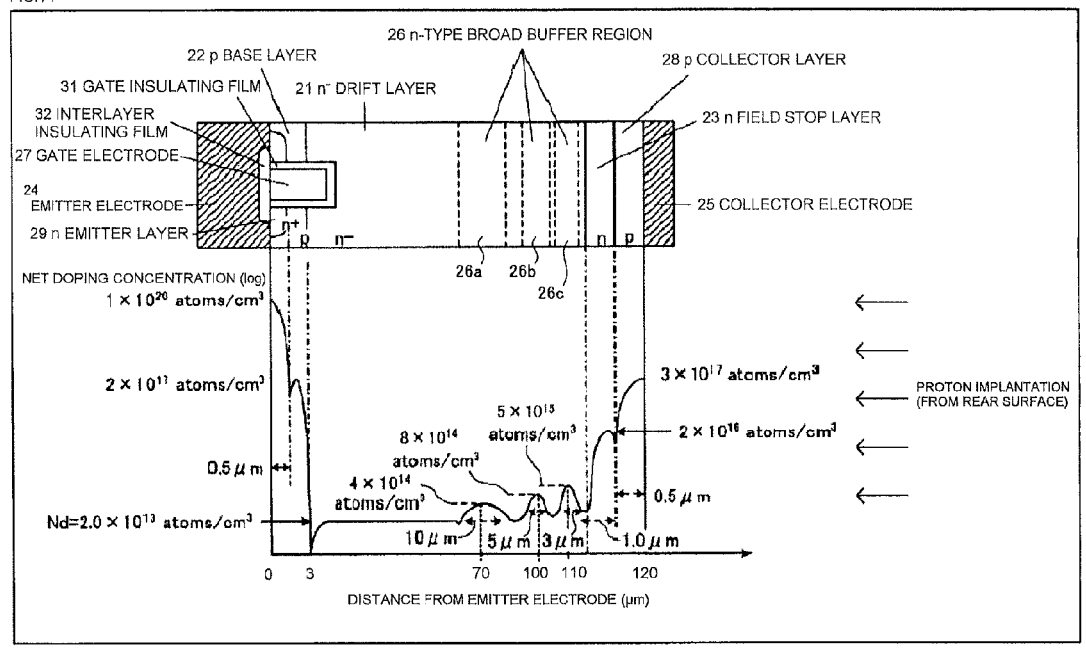
FIG. 14 is a diagram illustrating another example of the structure of the semiconductor device according to embodiments of the invention.

FIG. 14 is a diagram illustrating another example of the structure of the semiconductor device according to embodiments of the invention. The semiconductor device shown in FIG. 14 is an IGBT with a BB layer structure in which an n-type broad buffer (BB) region is provided in an n⁻ drift layer 21. In FIG. 14, the cross-sectional structure of the broad buffer (BB) IGBT is shown on the upper side and the net doping concentration distribution of the broad buffer (BB) IGBT is shown on the lower side. In the net doping concentration distribution shown on the lower side of FIG. 14, the horizontal axis is a depth from the interface between an emitter electrode 24 and the front surface of an n⁻ semiconductor substrate, which is the n⁻ drift layer 21, and the vertical axis is the net doping concentration of an n-type donor and a p-type acceptor with different polarities.

The n⁻ drift layer 21 (for example, a thickness of 107 μm) is an n⁻ semiconductor substrate (an n-type semiconductor wafer with a thickness of, for example, 120 μm) formed by a floating zone (FZ) method or a Czochralski (CZ) method. A p base layer 22 (for example, a depth of 3 μm) with a concentration higher than that of the n⁻ drift layer 21 is selectively formed in a surface layer of the front surface of the n⁻ semiconductor substrate. An n emitter layer 29 (for example, a depth of 0.5 μm) with a concentration higher than that of the p base layer 22 is formed in the p base layer 22. A trench is formed at a depth of about 5 μm from the front surface of the n⁻ semiconductor substrate through the n emitter layer 29 and the p base layer 22. In the trench, a gate electrode 27 is formed so as to face the n emitter layer 29, the p base layer 22, and the n⁻ drift layer 21 with a gate insulating film 31 interposed therebetween. That is, a known MOS gate (an metal-oxide film-semiconductor insulated gate) structure including the p base layer 22, the n emitter layer 29, the gate insulating film 31, and the gate electrode 27 is formed.

A p collector layer 28 (for example, a depth of 0.5 μm) with a concentration higher than that of the n⁻ drift layer 21 is formed on the rear surface of the n⁻ semiconductor substrate and an n field stop (FS) 23 (for example, a depth of 1.0 μm) with a concentration higher than that of the n⁻ drift layer 21 is formed adjacent to the p collector layer 28 in the depth direction. A plurality of n-type broad buffer (BB) regions 26 with a concentration that is higher than that of the n⁻ drift layer 21 and is lower than that of the n FS layer 23 are formed in a portion of the n⁻ drift layer 21 from a pn junction surface between the p base layer 22 and the n⁻ drift layer 21 to the n FS layer 23. The n-type BB region 26 is a donor layer which has complex defects including the VOH complex defect and is formed by proton radiation and the subsequent heat treatment. In this case, the proton radiation may be performed from any of the front surface and the rear surface of the substrate. However, it is preferable that the proton radiation be performed from the rear surface of the substrate. The reason is that the range of the proton can be lower than that when the proton radiation is performed from the front surface of the substrate and it is possible to reduce the number of defects (disorders) remaining in the n⁻ semiconductor substrate.

Among the plurality of n-type BB regions 26, the n-type BB region 26a which is closest to the emitter electrode 24 has the maximum concentration (peak position) at a depth of 70 μm from the interface between the emitter electrode 24 and the n⁻ semiconductor substrate and at a depth of 50 μm from the interface between the collector electrode 25 and the n⁻ semiconductor substrate. The maximum concentration of the n-type BB region 26a is, for example, $4 \times 10^{14}$ atoms/cm³ and the width (thickness in the depth direction) of the n-type BB region 26a is about 10 μm. Here, the term 'width' means, for example, the distance between two points where concentration is 1/e of the maximum concentration of the n-type BB region 26, but may be a full width at half maximum (FWHM). The n-type BB region 26a is formed by radiating a proton from the rear surface (collector layer) of the substrate. When the n-type BB region 26a is formed, the acceleration energy of the proton is, for example, 2.07 MeV so as to correspond to a depth of 50 μm from the rear surface of the substrate. The proton dose is, for example, $3 \times 10^{13}$ atoms/cm².

The peak position of the n-type BB region 26b is at a depth of about 20 μm from the interface between the collector electrode 25 and the n⁻ semiconductor substrate. The maximum concentration of the n-type BB region 26b is, for example, $8 \times 10^{14}$ atoms/cm³ and the width of the n-type BB region 26b is about 5 μm. When the n-type BB region 26b is formed, the acceleration energy of a proton is, for example, 1.34 MeV. The proton dose is, for example, $3 \times 10^{13}$ atoms/cm². The peak position of the n-type BB region 26c closest to the collector electrode 25 is at a depth of 10 μm from the interface between the collector electrode 25 and the n⁻ semiconductor substrate. The maximum concentration of the n-type BB region 26c is, for example, $5 \times 10^{15}$ atoms/cm³ and the width of the n-type BB region 26c is about 3 μm. When the n-type BB region 26c is formed, the acceleration energy of a proton is 736 keV. The proton dose is, for example, $2 \times 10^{14}$ atoms/cm².

The examination result of the inventors proved that, for the range Rp (here, the peak position of the n-type BB region 26) of the proton and the acceleration energy E of the proton, when the logarithm log(Rp) of the range Rp of the proton was x and the logarithm log(E) of the acceleration energy E of the proton was y, the following Expression 3 was established.

$$y = -0.0047x^4 + 0.0528x^3 - 0.2211x^2 + 0.9923x + 5.0474 \quad \text{[Expression 3]}$$

Figure 17:
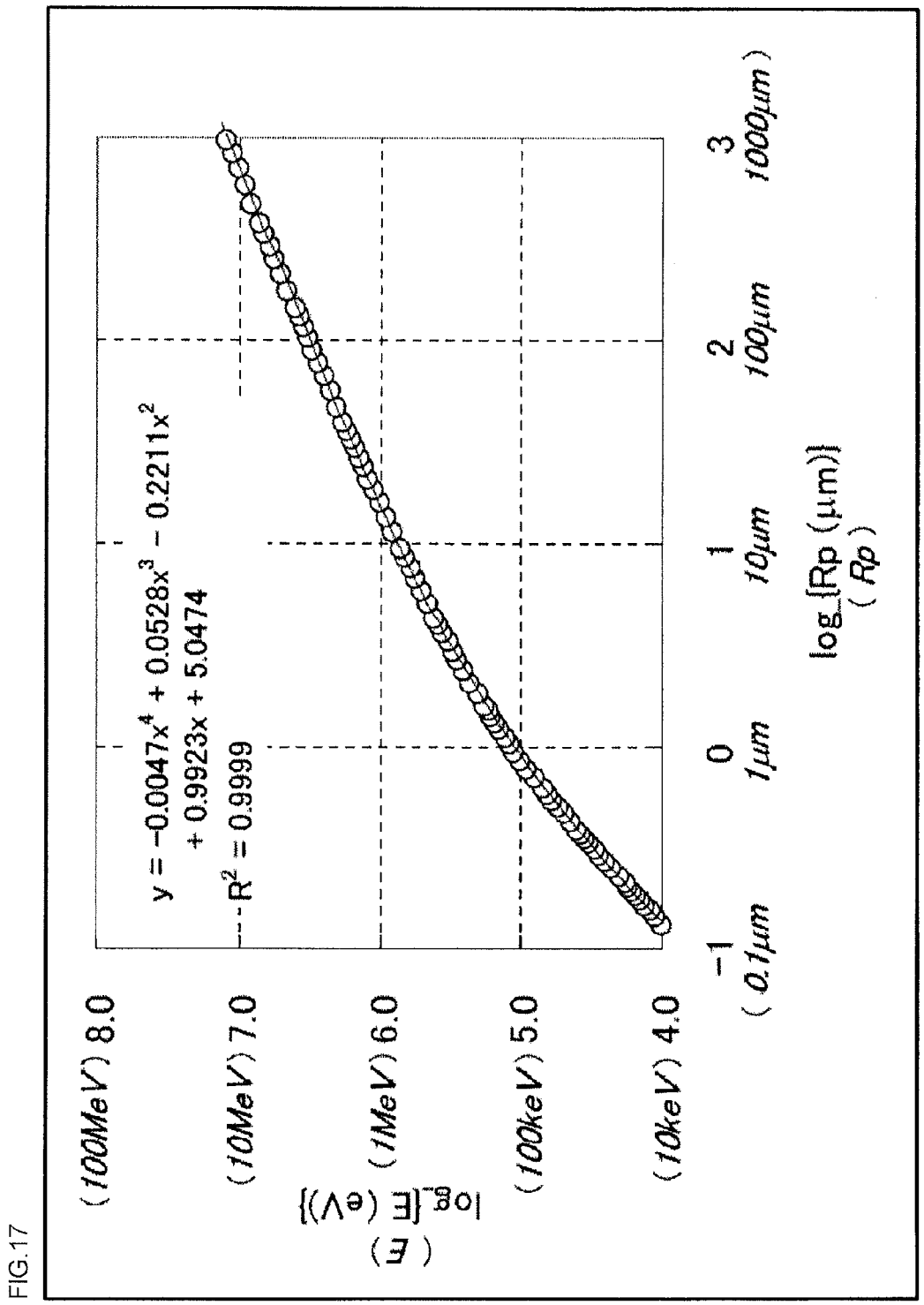
FIG. 17 is a characteristic diagram illustrating the relationship between the range of a proton and the acceleration energy of the proton in the semiconductor device according to embodiments of the invention.

FIG. 17 is a characteristic graph illustrating the above-mentioned Expression 3. FIG. 17 is a characteristic diagram illustrating the relationship between the range of the proton and the acceleration energy of the proton in the semiconductor device according to embodiments of the invention. FIG. 17 shows the acceleration energy of the proton for obtaining the desired range of the proton. In FIG. 17, the horizontal axis is the logarithm log(Rp) of the range Rp of the proton and indicates the range Rp (μm) corresponding to parentheses below a value on the axis of log(Rp). In addition, the vertical axis is the logarithm log(E) of the acceleration energy E of the proton and indicates the acceleration energy E of the proton corresponding to the left parentheses of a value on the axis of log(E). The above-mentioned Expression 3 fits the logarithm log(Rp) of the range Rp of the proton and the logarithm log(E) of the acceleration energy with the quark of x (=log(Rp)).

The above-mentioned Expression 3 can be used to calculate the acceleration energy E of the proton required to obtain the desired range Rp of the proton. The acceleration energy E of the proton for forming each of the n-type BB regions 26a to 26c is also calculated by the above-mentioned Expression 3 and the calculation result is substantially identical to the actually measurement value of the sample which is irradiated with protons with the above-mentioned acceleration energy by a known spreading resistance measurement method (SR method). Therefore, the use of the above-mentioned Expression 3 makes it possible to predict the necessary acceleration energy E of the proton with high accuracy, on the basis of the range Rp of the proton.

Figure 15:
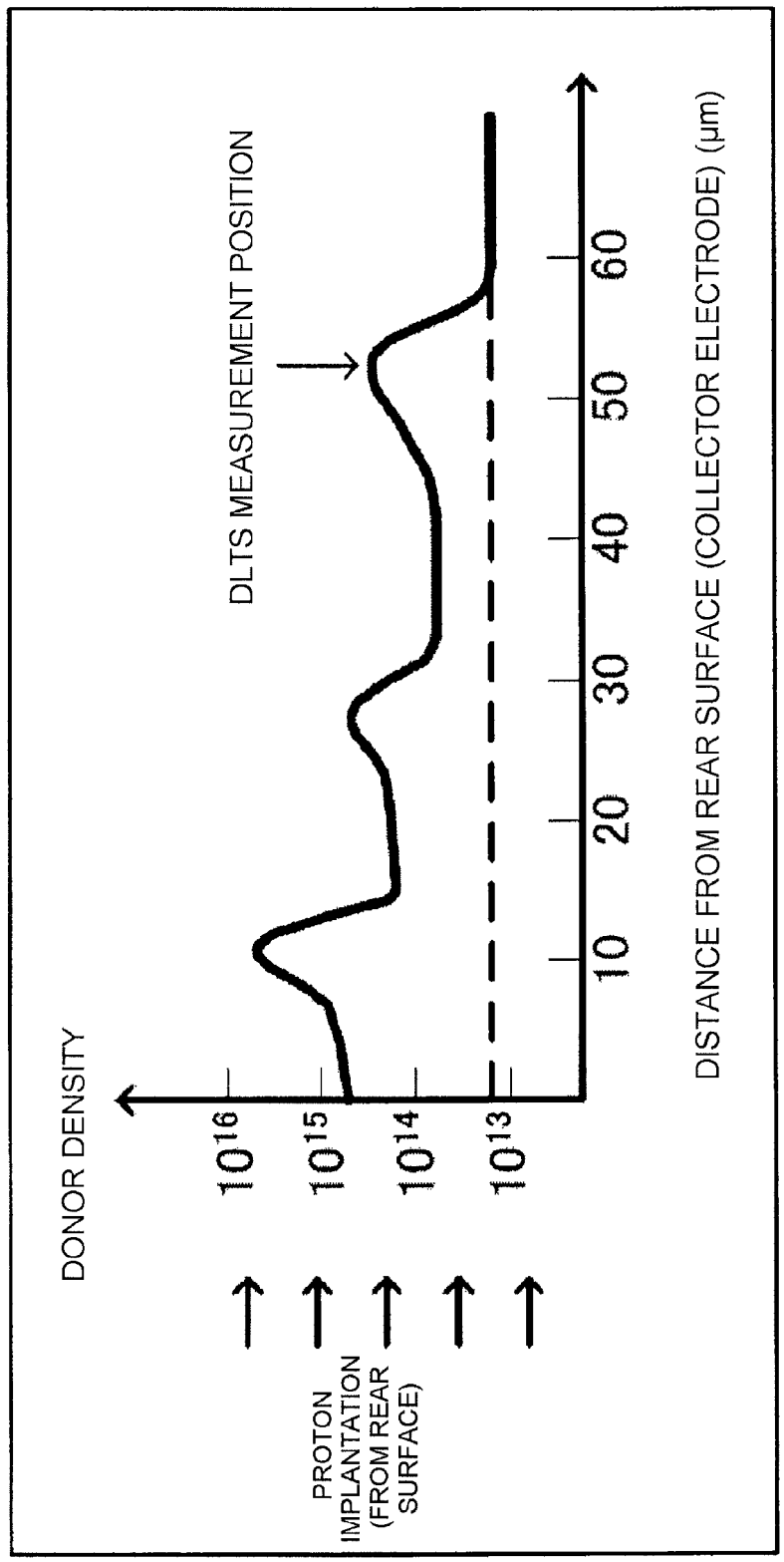
FIG. 15 is an enlarged view illustrating a portion of a net doping concentration distribution shown in FIG. 14.

FIG. 15 is an enlarged view illustrating a portion of the net doping concentration distribution shown in FIG. 14. FIG. 15 shows the donor concentration distribution in the direction from the collector electrode 25 to the emitter electrode 24 shown in FIG. 14. In FIG. 15, the horizontal axis is the distance (depth) from the interface between the collector electrode 25 and the rear surface of the n⁻ semiconductor substrate. Since the concentration distribution shown in FIG. 15 is donor concentration, the distribution of the p collector layer 28 is not shown. The structure in which the first BB layer (the BB layer closest to the emitter electrode 24) is formed at a depth of about 50 µm from the interface between the collector electrode 25 and the rear surface of the n⁻ semiconductor substrate is effective in preventing the turn-off oscillation phenomenon of the IGBT (the waveform starts to oscillate during a turn-off process). The reason is as follows. When the depletion layer is spread from the p base layer 22 in the surface layer to the n⁻ drift layer 21 during turn-off, the end of the depletion layer reaches the first BB layer to suppress the spreading of the depletion layer and the sweep of the accumulated carrier is weakened. As a result, the depletion of the carrier is suppressed and oscillation is suppressed.

The preferred peak position (the position where the BB layer has the maximum concentration) of the BB layer which the end of the depletion layer reaches first will be described. During turn-off, the depletion layer is spread in the depth direction from the pn junction J1 between the p base layer 22 and the n⁻ drift layer 21 to the collector electrode 25. Therefore, the peak position of the BB layer which the end of the depletion layer reaches first is the n-type BB region 26a closest to the pn junction J1. Here, the thickness of the n" semiconductor substrate (the thickness of a portion interposed between the emitter electrode 24 and the collector electrode 25) is W0 and the depth (hereinafter, referred to as the distance from the rear surface) of the peak position of the n-type BB region 26a which the end of the depletion layer reaches first from the interface between the collector electrode 25 and the rear surface of the n⁻ semiconductor substrate is X. Here, a distance index L is introduced. The distance index L is represented by the following Expression 4.

$$L = \sqrt{\frac{BV\varepsilon_s}{q\left(\frac{J_F}{qv_{sat}} + N_{dm}\right)}} \qquad [\text{Expression 4}]$$

(where BV: an element rated voltage
$\varepsilon_s$: the permittivity of a semiconductor
q: elementary charge
$J_F$: the density of the element rated current
$v_{sat}$: a carrier saturation velocity
$N_{dm}$: the average concentration of a first-dielectric-type drift layer)

The distance index L represented by the above-mentioned Expression 4 is an index indicating the distance of the end (depletion layer end) of the depletion layer (exactly a space-charge region), which is spread from the pn junction J1 to the n⁻ drift layer 21, from the pn junction J1 when an anode-cathode current is the maximum, that is, a reverse recovery current is the maximum during turn-off. Among the frictions in the square root, a denominator indicates the space-charge density of the space-charge region (simply, the depletion layer) during turn-off. The known Poisson equation is represented by $\text{div}E=\rho/\varepsilon$ (where E is the intensity of the electric field, $\rho$ is space-charge density, and $\rho=q(p-n+Nd-Na)$ is established. In Expression 4, q is elementary charge, p is hole concentration, n is electron concentration, Nd is donor concentration, Na is acceptor concentration, ands is the permittivity of the semiconductor.

The space-charge density $\rho$ is described by the concentration p of holes passing through the space-charge region (depletion layer) during turn-off and the average donor concentration $N_{dm}$ of the n⁻ drift layer 21 and can be represented by $\rho \approx q(p+N_{dm})$ since the electron concentration is significantly lower than these densities so as to be negligible and there is no acceptor. In this case, the hole concentration p is determined by the breaking current of the IGBT. In particular, since a situation where the element flows current in its rated current density is assumed, the hole concentration p is represented by $p=J_F/(qv_{sat})$ (where $J_F$ is the rated current density of the element and $v_{sat}$ a saturation velocity at which the velocity of the carrier is saturated by predetermined electric field intensity.

When the Poisson equation is integrated with respect to the distance x two times and boundary conditions are appropriately set, the voltage V is represented by $V=(\frac{1}{2})(\rho/\varepsilon)x^2$ since $E=-\text{grad}V$ (the relationship between a known electric field E and the voltage V) is established. Here, x is the length of the space-charge region and it is noted that x is different from the log(Rp) in the above-mentioned Expression 3. In addition, E is the electric field and is different from the acceleration energy in the above-mentioned Expression 3. The length x of the space-charge region obtained when the voltage V is half the rated voltage BV is the distance index L. The reason is that, in the actual device, such as an inverter, an operating (power supply voltage) voltage which is the voltage V is about half the rated voltage. The doping concentration of the n-type BB region 26 is higher than that of the n⁻ drift layer 21 to make it difficult for the space-charge region to expand in the n-type BB region 26 during turn-off. When the MOS gate is turned off, the collector current of the IGBT starts to be reduced from the breaking current, and the peak position of the n-type BB region 26 which the depletion layer reaches first is within the length range of the space-charge region, it is possible to suppress the expansion of the space-charge region, with the accumulated carrier remaining in the n⁻ drift layer 21. Therefore, it is possible to suppress the sweep of the remaining carrier.

In the actual turn-off operation, for example, when a motor is driven by a known PWM inverter, the power supply voltage or the breaking current of the IGBT module is not fixed, but is variable. Therefore, in this case, the preferred peak position of the n-type BB region 26 which the depletion layer reaches first needs to have a relatively large width. According to the examination result of the inventors, the distance X of the peak position of the n-type BB region 26a which the depletion layer reaches first from the rear surface is as shown in FIG. 18. FIG. 18 is a table illustrating the position conditions of the n-type BB region which the depletion layer reaches first in the semiconductor device according to embodiments of the invention. FIG. 18 shows the distance X of the peak position of the n-type BB region 26a which the end of the depletion layer reaches first from the rear surface at a rated voltage of 600 V to 6500 V.

As shown in FIG. 18, at each rated voltage, the safety design is applied such that the element (IGBT) has a breakdown voltage that is about 10% higher than the rated voltage. As shown in FIG. 18, the total thickness of the n⁻ semiconductor substrate (the finished thickness after a thinning process such as grinding) and the average resistivity of the n-drift layer 21 are set such that the on-voltage or turn-off loss is sufficiently low. The term 'average' means the average concentration and resistivity of the entire n⁻ drift layer 21 including the n-type BB region 26. The rated voltage causes the rated current density to have a typical value shown in FIG. 18. The rated current density is set such that energy density determined by the product of the rated voltage and the rated current density has a substantially constant value and has the value shown in FIG. 18. When the distance index L is calculated by the above-mentioned Expression 4 using these values, the value shown in FIG. 18 is obtained. The distance X of the peak position of the n-type BB region 26a which the end of the depletion layer reaches first from the rear surface is calculated by subtracting a value that is 0.7 to 1.6 times the distance index L from the thickness W0 of the n⁻ semiconductor substrate.

It was confirmed that the distance X, which was capable of sufficiently suppressing turn-off oscillation for the distance index L and the thickness W0 of the n⁻ semiconductor substrate, of the peak position of the n-type BB region 26a which the end of the depletion layer reached first from the rear surface satisfied the following Expression 5 at any rated voltage.

$$W0-1.5L \leq X \leq W0-0.8L \quad \text{[Expression 5]}$$

The above-mentioned Expression 5 results from the substantially constant product of the rated voltage and the rated current density. Therefore, when the distance X of the peak position of the n-type BB region 26a which the end of the depletion layer reaches first from the rear surface is within the range of the above-mentioned Expression 5, a sufficient number of accumulated carriers can remain in the IGBT during turn-off and it is possible to suppress the oscillation phenomenon during turn-off. Thus, the distance X of the peak position of the n-type BB region 26a which the end of the depletion layer reaches first from the rear surface may be within the range of the above-mentioned Expression 5 at any rated voltage. It is preferable that the distance X satisfy the following Expression 6 in order to further improve the effect of suppressing the oscillation phenomenon during turn-off. It is more preferable the distance X satisfy the following Expression 7.

$$W0-1.4L \leq X \leq W0-0.9L \quad \text{[Expression 6]}$$

$$W0-1.3L \leq X \leq W0-1.0L \quad \text{[Expression 7]}$$

The acceleration energy of the proton may be determined from the above-mentioned Expression 4 and the characteristic graph shown in FIG. 17 in order to form the n-type BB region 26a which the depletion layer reaches first and in which the distance X of the peak position from the rear surface satisfies the conditions of the above-mentioned Expression 6 or 7 using proton radiation.

Next, a method of manufacturing the IGBT shown in FIG. 14 will be described. FIG. 19 is a cross-sectional view illustrating a state during the manufacture of the semiconductor device shown in FIG. 14. An example in which an IGBT with a rated voltage $V_0$ of 1200 V and a rated current of 150 A will be described. First, as the wafer (n⁻ semiconductor substrate), an FZ wafer 20 with a bulk resistivity of 144 Ωcm to 300 Ωcm, for example, 150 Ωcm (a phosphorus concentration of $2.0 \times 10^{13}$ atoms/cm³) and a thickness of about 500 μm is prepared. The FZ wafer 20 is used as the n⁻ drift layer (FIG. 19(a)). Oxygen with a concentration higher than solid solubility at room temperature (for example, 20° C.) may be diffused in the FZ wafer 20 by driving in advance and the FZ wafer 20 may be introduced.

Then, the p base layer 22, a termination structure including a guard ring (not shown), the trench, the gate insulating film 31 and the gate electrode 27 in the trench, the n emitter layer 29, and an interlayer insulating film 32 are formed on the front surface of the FZ wafer 20 by a standard IGBT manufacturing process (FIG. 19(b)). The impurity concentration of the p base layer 22 is, for example, $2 \times 10^{17}$ atoms/cm³ and the junction depth thereof from the surface is, for example, 3 μm. The impurity concentration of the n emitter layer 29 is $1 \times 10^{20}$ atoms/cm³ and the junction depth thereof from the surface is, for example, 0.5 μm. The material forming the gate electrode 27 may be, for example, polysilicon.

Then, the emitter electrode 24 which comes into contact with the n emitter layer 29 is formed. In addition, a protective film (not shown) is formed in the termination structure including the guard ring. The emitter electrode 24 is made of, for example, Al—Si1% and the protective film is, for example, a polyimide film or a silicon nitride (SiN) film. Then, grinding and wet etching 42 are performed for the rear surface of the FZ wafer 20 to reduce the thickness of the FZ wafer 20 to a desired value (FIG. 19(c)). In this stage, the thickness of the FZ wafer 20 is in the range of, for example, 100 μm to 160 μm when the rated voltage $V_0$ is 1200 V. In this stage, the thickness of the FZ wafer 20 is 120 μm.

Then, the rear ground and etched surface (the surface on which the collector electrode 25 will be formed later) of the FZ wafer 20 is irradiated with protons H⁺ 41 which is accelerated by, for example, an electrostatic accelerator (FIG. 19(d)). At that time, the range Rp of the proton H⁺ 41 is 70 μm from the front surface of the FZ wafer 20, that is, 50 μm from the rear ground and etched surface. In this case, the acceleration energy of the proton is 2.06 MeV and the dose of the protons H⁺ 41 is $1.0 \times 10^{14}$ atoms/cm². An aluminum absorber is not used. In FIG. 19(d), crystal defects 13 which are generated in the FZ wafer 20 by the radiation of the protons H⁺ 41 are represented by a mark x.

Then, for example, a heat treatment is performed in a nitrogen atmosphere (hydrogen may not be included) at a temperature of 400° C. for five hours to recovery the crystal defects 13. In this way, an n-type high-concentration region is formed at a depth of about 50 μm from the rear surface of the FZ wafer 20. A desired n-type BB region 26 is formed by the high-concentration region (FIG. 19(e)). The processes shown in FIGS. 19(d) and 19(e) are repeatedly performed to form the plurality of n-type BB regions 26 shown in FIG. 14. In FIGS. 19(e) to 19(h), the plurality of n-type BB regions 26 are shown as one layer.

Then, the rear surface of the FZ wafer 20 subjected to the grinding and the wet etching 42 is irradiated with n-type impurities, such as protons H⁺ or phosphorus⁺ 15 which will be the n FS layer 23. In the irradiation with the n-type impurities, the dose of the n-type impurities is set such that the impurity concentration of the n FS layer 23 after activation (which will be described) is, for example, $2 \times 10^{16}$ atoms/cm³ (FIG. 19(f)). Then, p-type impurity ions, such as boron ions⁺ 14 which will be the p collector layer 28, are implanted (FIG. 19(g)). In the ion implantation, acceleration energy is, for example, 50 keV and the dose of the p-type impurities is set such that the impurity concentration of the p collector layer 28 after activation is $3 \times 10^{17}$ atoms/cm³.

Then, the p collector layer 28 to be electrical activated by laser annealing is formed on the ion-implanted surface (rear surface) of the FZ wafer 20. The p collector layer 28 may be activated by furnace annealing, instead of the laser annealing. In the case of the furnace annealing, for example, a heat treatment is performed in a nitrogen atmosphere at a temperature of 450° C. for five hours (hydrogen may not be included). Finally, metal films are deposited on the surface of the p collector layer 28 in the order of, for example, Al—Si1%, titanium, nickel, and gold to form the collector electrode 25 which comes into ohmic contact with the surface of the p collector layer 28 (FIG. 19(h)). In this way, the IGBT shown in FIG. 14 is completed.

Next, the formation conditions of the n-type BB region of the IGBT will be described. During turn-off or reverse recovery, the number of accumulated carriers remaining in the rear surface (a region from about 0 μm to 50 μm on the horizontal axis in FIG. 15) is reduced. The region in which the carrier remains is referred to as a residual region. The carrier in the residual region suppresses the oscillation of the diode or the IGBT. However, there are many defects (disorders) in the residual region, the disorder becomes the recombination center. When a large number of recombination centers remain, the lifetime is reduced and the reduction rate of the carrier increases. As a result, even when the BB layer is formed, oscillation is likely to occur. In the case of the IGBT, as described above, since the proton is radiated from the rear surface of the wafer, the residual region is disposed in the region through which the proton passes and the disorder is likely to remain. Therefore, particularly, in the IGBT, it is necessary to reduce the disorder of the residual region which is also the region through which the proton passes.

In order to reduce the disorder, it is necessary to reduce the proton dose, increase the annealing temperature after proton radiation, or increase the time. However, in order to form the BB layer with predetermined doping concentration, it is necessary to ensure a certain proton dose and a certain activation ratio (the ratio of the donor-integrated concentration obtained by integrating the proton dose with respect to the region of the formed BB layer). When the donor layer of the diode according to Embodiment 3 is formed, the lifetime of the diode can be reduced (for example, in the range of 0.3 μs to 3.0 μs). Therefore, the heat treatment temperature is set to 350° C. In contrast, during the formation of the donor layer (BB layer) of the IGBT, when a heat treatment temperature of 350° C. is applied, the number of defects increases and the on-voltage increases, which is not preferable. Therefore, the annealing temperature needs to be at least equal to or higher than 350° C. and, preferably, equal to or higher than 380° C.

When the annealing temperature after proton radiation is higher than 450° C., there is a concern that the aluminum thin film forming the emitter electrode 24 which has been formed on the surface of the wafer will be deformed. Therefore, it is difficult to set the annealing temperature to be higher than 450° C. It is preferable that the annealing temperature after proton radiation be equal to or less than 450° C. An example of the result obtained when the annealing temperature after proton radiation is 400° C. will be described with reference to the characteristic diagram shown in FIG. 16 which will be described below.

Figure 16:
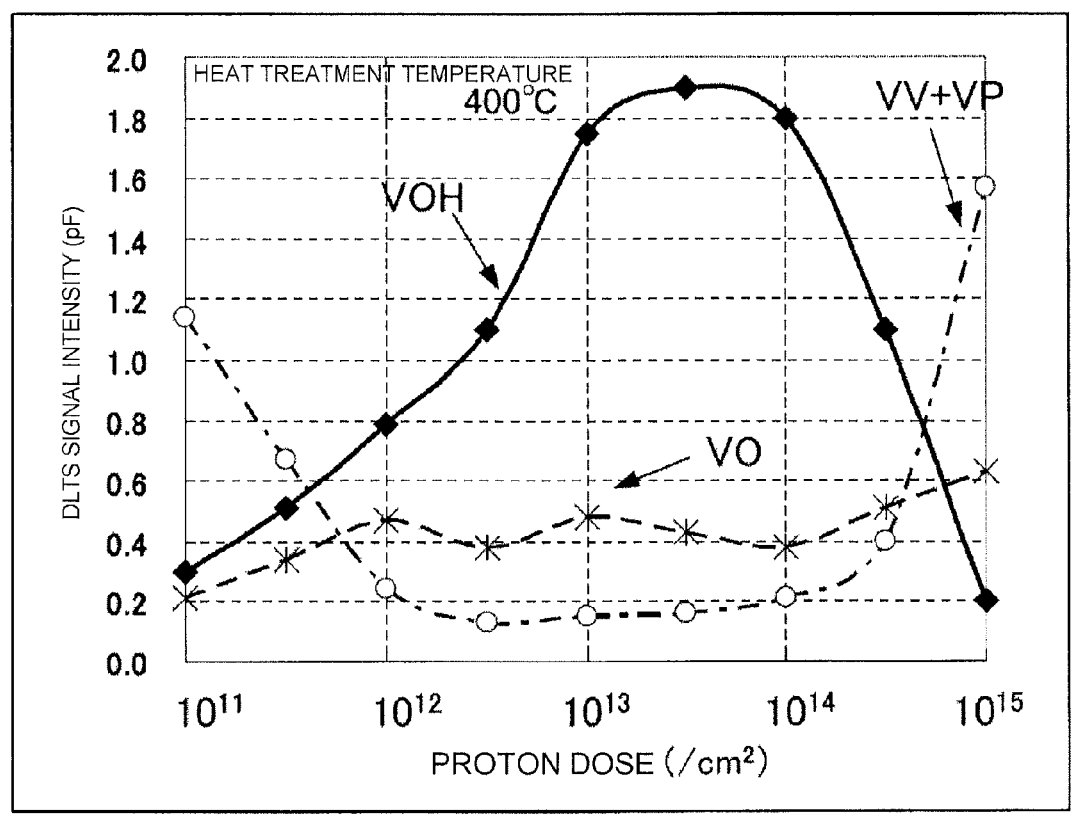
FIG. 16 is a characteristic diagram illustrating the relationship between a proton dose and DLTS signal intensity after proton radiation in the semiconductor device shown in FIG. 14.

FIG. 16 is a characteristic diagram illustrating the relationship between the DLTS signal intensity and the proton dose of the semiconductor device shown in FIG. 14 after proton radiation. FIG. 16 shows the dependence of the DLTS signal intensity of each of the VOH complex defect, the VO complex defect, and the VV+VP complex defect on the proton dose when the DLTS signal intensity is measured at the maximum concentration position of the deepest n-type BB region 26a in FIG. 15. As shown in FIG. 16, the DLTS signal intensity of the VV+VP complex defect is lower than that of the other defects in the range of $7\times10^{11}/cm^2$ to $3\times10^{14}/cm^2$ and the ratio of the defect (trap) density of the VV+VP complex defect is reduced.

On the other hand, the signal intensity of the VOH complex defect is higher than that of the other defects in the range of $5\times10^{11}/cm^2$ to $5\times10^{14}/cm^2$ and the ratio of the defect (trap) density of the VOH complex defect increases. It was confirmed that this tendency was common when the annealing temperature after proton radiation was in the range of 380° C. to 450° C. In particular, the tendency is strong when the annealing temperature after proton radiation is in the range of 390° C. to 420° C. Therefore, the annealing temperature after proton radiation is preferably in the range of 380° C. to 450° C. and more preferably, in the range of 390° C. to 420° C. In any one of the two temperature ranges, the proton dose is preferably in the range of $5\times10^{11}/cm^2$ to $5\times10^{14}/cm^2$, more preferably, in the range of $7\times10^{11}/cm^2$ to $3\times10^{14}/cm^2$, and most preferably, in the range of $1\times10^{12}/CM^2$ to $3\times10^{14}/cm^2$. In this case, the defect density of the VOH complex defect is higher than that of the other defects, which is preferable.

The DLTS signal intensity of the VOH complex defect is significantly higher than that of the other defects when the proton dose is in the range of $3\times10^{12}/cm^2$ to $3\times10^{14}/cm^2$. This means that the ratio of the defect (trap) density of the VOH complex defect is high as described above. The above dose range is preferable since the disorder and the leakage current are reduced. In particular, as can be seen from the above, when the proton dose is in the range of $1\times10^{13}/cm^2$ to $1\times10^{14}/cm^2$, the DLTS signal intensity of the VOH complex defect is critically high and the ratio of the defect (trap) density of the VOH complex defect is critically higher than that of the other defects (the VO complex defect and the VV+VP complex defect). Therefore, in the case of the BB layer of the IGBT, it is most preferable that the proton dose be equal to or more than $1\times10^{13}/cm^2$ and equal to or less than $1\times10^{14}/cm^2$. In addition, in each of the above-mentioned ranges of the proton dose, the temperature of annealing which is performed after the proton radiation is equal to or higher than 390° C. and equal to or lower than 420° C., which makes it possible to significantly increase the ratio of the VOH complex defect.

Next, oxygen concentration of the semiconductor substrate which is required to form the VOH complex defect and the VO complex defect will be described. When a substrate is formed by the FZ method or the CZ method, oxygen in the semiconductor substrate enters the substrate during a high-temperature heat treatment or an oxidizing process. However, when the oxygen concentration is too low, the VOH complex defect and the VO complex defect are not sufficiently formed. The examination result of the inventors proved that the preferred DLTS signal intensity (defect/trap density) of the VOH complex defect and the VO complex defect was obtained when the oxygen concentration was equal to or higher than $1\times10^{15}/cm^3$. It is preferable that the oxygen concentration be high. However, it was confirmed that, when the oxygen concentration was higher than $1\times10^{18}/cm^3$, an oxide-induced stacking fault (OSF) occurred remarkably during a process, resulting in deterioration of the characteristics of the element (an increase in the on-voltage increases and an increase in the leakage current) or a reduction in yield. Therefore, it is preferable that the oxygen concentration of the semiconductor substrate be equal to or lower than $1\times10^{18}/cm^3$.

As described above, according to the invention, the VOH complex defect is mainly formed in the drift layer by proton radiation. Therefore, even when the density of the crystal defects formed by the proton radiation is increased in order to increase the impurity concentration of the donor layer, it is possible to effectively change a large number of main crystal defects into donors with a high rate. In this way, it is possible to form the donor layer which is little affected by, for example, an increase in the on-voltage or an increase in the leakage current in the drift layer. Therefore, it is possible to provide a semiconductor device capable of suppressing an increase in the on-voltage and an increase in the leakage current.

In the above-described embodiments, the semiconductor device and the method of manufacturing the semiconductor device according to the invention are applied to the FS layer of the diode or the BB layer of the IGBT. However, the invention can be similarly applied to any structure in which the donor layer is formed in the drift layer by proton radiation. For example, the invention can be applied to the FS layer of the IGBT. In this case, the effect of the invention is also obtained.

As described above, the semiconductor device and the method of manufacturing the semiconductor device according to embodiments of the invention are useful for a power semiconductor device which is used in, for example, a pin diode or an IGBT.

REFERENCE NUMERALS AND ELEMENTS LIST 1 n⁻ SEMICONDUCTOR SUBSTRATE, WAFER
2 n-TYPE DRIFT LAYER
3 DONOR LAYER
4 ANODE REGION
5 CATHODE REGION
6 GUARD RING
7 BB LAYER
8 ANODE ELECTRODE
9 CATHODE ELECTRODE
10 pin DIODE
11 FIELD PLATE Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   a first-conduction-type drift layer which is a semiconductor substrate including a first-conduction-type impurity and a first complex defect caused by a vacancy, an oxygen atom, and a hydrogen atom;
   a plurality of donor layers provided at different depths in a depth direction of the first-conduction-type drift layer, each of the donor layers includes donors caused by the first complex defect; and
   a second-conduction-type semiconductor region provided on one main surface of the first-conduction-type drift layer,
   wherein each of the donor layers has an impurity concentration distribution that includes a first portion with a maximum impurity concentration and a second portion with a concentration gradient in which the impurity concentration is reduced from the first portion to both main surfaces of the first-conduction-type drift layer,
   the first-conduction-type drift layer further includes a second complex defect caused by a divacancy, the vacancy, and the first-conduction-type impurity, and a third complex defect caused by the vacancy and the oxygen atom, and
   a signal intensity of the first complex defect measured by a deep level transient spectroscopy method is higher than a signal intensity of the second complex defect measured by the deep level transient spectroscopy method.

2. The semiconductor device according to claim 1, wherein the signal intensity of the first complex defect measured by the deep level transient spectroscopy method is higher than two times the signal intensity of the second complex defect measured by the deep level transient spectroscopy method.

3. The semiconductor device according to claim 1, wherein a signal intensity of the third complex defect measured by the deep level transient spectroscopy method is higher than the signal intensity of the second complex defect measured by the deep level transient spectroscopy method and is lower than the signal intensity of the first complex defect measured by the deep level transient spectroscopy method.

4. The semiconductor device according to claim 3, wherein the signal intensity of the first complex defect measured by the deep level transient spectroscopy method is higher than two times the signal intensity of the third complex defect measured by the deep level transient spectroscopy method.

5. The semiconductor device according to claim 3, wherein a trap level density of the first complex defect is higher than a trap level density of the second complex defect.

6. The semiconductor device according to claim 5, wherein the trap level density of the first complex defect is higher than two times the trap level density of the second complex defect.

7. The semiconductor device according to claim 5, wherein a trap level density of the third complex defect is higher than the trap level density of the second complex defect and is lower than the trap level density of the first complex defect.

8. The semiconductor device according to claim 7, wherein the trap level density of the first complex defect is higher than two times the trap level density of the third complex defect.

9. The semiconductor device according to claim 1, wherein the semiconductor device is a pin diode including a first-conduction-type semiconductor region and a further second-conduction-type semiconductor region which face each other with the first-conduction-type drift layer interposed therebetween and have a resistance lower than the first-conduction-type drift layer.

10. The semiconductor device according to claim 1, wherein the semiconductor device is an insulated gate bipolar transistor that has a metal-oxide film-semiconductor insulated gate structure formed on one main surface of the first-conduction-type drift layer.

11. The semiconductor device according to claim 1, wherein, when a distance index indicating a distance of an end of a depletion layer, which is spread from a pn junction between the first-conduction-type drift layer and the second-conduction-type semiconductor region when the semiconductor device is turned off, from the pn junction is represented by the following Expression and the thickness of the first-conduction-type drift layer is W0, a distance X of a concentration peak position of the donor layer which the depletion layer reaches first among the plurality of donor layers from the other main surface of the first-conduction-type drift layer satisfies W0−1.5 L≤X≤W0−0.8 L, $$L = \sqrt{\frac{BV\varepsilon_s}{q\left(\frac{J_F}{qv_{sat}} + N_{dm}\right)}}$$ Expression (where BV: an element rated voltage
$\varepsilon_s$: the permittivity of a semiconductor
q: elementary charge
$J_F$: the density of an element rated current
$v_{sat}$: a carrier saturation velocity
$N_{dm}$: the average concentration of a first-dielectric-type drift layer).

12. The semiconductor device according to claim 11, wherein the distance X satisfies W0−1.4 L≤X≤W0−0.9 L.

13. The semiconductor device according to claim 11, wherein the distance X satisfies W0−1.3 L≤X≤W0−1.0 L.

* * * * *